US012676459B2

(12) United States Patent　　(10) Patent No.:　US 12,676,459 B2
Kasai　　(45) Date of Patent:　Jul. 7, 2026

(54) LASER MODULE AND FIBER LASER DEVICE

(71) Applicant: Fujikura Ltd., Tokyo (JP)

(72) Inventor: Yohei Kasai, Chiba (JP)

(73) Assignee: Fujikura Ltd., Tokyo (JP)

( * ) Notice: Subject to any disclaimer, the term of this patent is extended or adjusted under 35 U.S.C. 154(b) by 694 days.

(21) Appl. No.: 18/041,607

(22) PCT Filed: Oct. 22, 2021

(86) PCT No.: PCT/JP2021/039066

§ 371 (c)(1),
(2) Date: Feb. 14, 2023

(87) PCT Pub. No.: WO2022/091959

PCT Pub. Date: May 5, 2022

(65) Prior Publication Data

US 2023/0352913 A1　　Nov. 2, 2023

(30) Foreign Application Priority Data

Oct. 26, 2020　　(JP) ................................. 2020-179187

(51) Int. Cl.
*H01S 5/40* 　　　(2006.01)
*H01S 5/02251* 　(2021.01)
(Continued)

(52) U.S. Cl.
CPC ........ *H01S 5/4012* (2013.01); *H01S 5/02251* (2021.01); *H01S 5/02253* (2021.01); *H01S 5/02326* (2021.01); *H01S 5/4087* (2013.01)

(58) Field of Classification Search
CPC .................................................... H01S 5/4087
See application file for complete search history.

(56) References Cited

U.S. PATENT DOCUMENTS

2012/0105968 A1　　5/2012　Chann et al.
2016/0344162 A1*　11/2016　Konno ................. B23K 26/705
(Continued)

FOREIGN PATENT DOCUMENTS

CN　　106532435 A　　3/2017
CN　　109075524 A　　12/2018
(Continued)

OTHER PUBLICATIONS

English Translation of Kirstaedter (Year: 2014).*
(Continued)

*Primary Examiner* — Minsun O Harvey
*Assistant Examiner* — Stephen Sutton Kotter
(74) *Attorney, Agent, or Firm* — Osha Bergman Watanabe & Burton LLP

(57) ABSTRACT

A laser module includes: a first laser diode that emits a first light beam having a first wavelength; a second laser diode that emits a second light beam having a second wavelength different from the first wavelength; a fast-axis collimating lens disposed corresponding to each of the first and second laser diodes to collimate a fast-axis direction of each of the first and second light beams emitted from each of the first and second laser diodes; a slow-axis collimating lens disposed corresponding to each of the first and second laser diodes to collimate a slow-axis direction of each of the first and second light beams emitted from each of the first and second laser diodes; and a wavelength combining element including a volume Bragg grating (VBG) or a diffraction grating.

14 Claims, 9 Drawing Sheets

(51) Int. Cl.
　　*H01S 5/02253*　　(2021.01)
　　*H01S 5/02326*　　(2021.01)

(56)　　　　　　References Cited

U.S. PATENT DOCUMENTS

| | | | |
|---|---|---|---|
| 2017/0271837 A1 | 9/2017 | Hemenway et al. | |
| 2018/0019576 A1 | 1/2018 | Guo et al. | |
| 2018/0191135 A1 * | 7/2018 | Yanase | H01S 5/02326 |
| 2021/0088657 A1 * | 3/2021 | Shah | G01S 17/42 |
| 2022/0128746 A1 * | 4/2022 | Chi | G02B 27/0172 |
| 2023/0108080 A1 * | 4/2023 | Fukakusa | G02B 27/1006 |
| | | | 372/92 |

FOREIGN PATENT DOCUMENTS

| | | | |
|---|---|---|---|
| DE | 102013105467 A1 | 12/2014 | |
| JP | 2014-216361 A | 11/2014 | |
| JP | 2016-224376 A | 12/2016 | |
| JP | 2020-166128 A | 10/2020 | |
| WO | WO-2014190975 A1 * | 12/2014 | H01S 5/4043 |
| WO | 2018/134966 A1 | 7/2018 | |
| WO | 2019/205500 A1 | 10/2019 | |

OTHER PUBLICATIONS

International Search Report issued in corresponding International Application No. PCT/JP2021/039066 mailed Nov. 22, 2021 (3 pages).

\* cited by examiner

THIRD DIRECTION

SECOND DIRECTION

FIRST DIRECTION

SECOND DIRECTION          THIRD DIRECTION

FIG. 9

THIRD DIRECTION

SECOND DIRECTION

FIG. 12

LASER MODULE AND FIBER LASER DEVICE

TECHNICAL FIELD

The present invention relates to a laser module and a fiber laser device, and specifically relates to a laser module that combines and emits light beams of different wavelengths, and a fiber laser device including the laser module.

BACKGROUND

In recent years, a fiber laser device has been required to have high output of emitted light beam, and for example, a pumping light beam emitted from a laser module has been increased in output in order to increase the output of the fiber laser device. For example, Patent Literature 1 below describes a laser module capable of increasing the output of the pumping light beam emitted from the laser module.

The laser module of Patent Literature 1 includes a plurality of laser diodes (LDs) that each emit light beam having a first wavelength and a plurality of LDs that each emit light beam having a second wavelength. These LDs are placed such that an active layer is parallel to a mounting surface on which the LDs are mounted. Therefore, the fast axis of the light beam emitted from the LD is perpendicular to the mounting surface, and the slow axis is parallel to the mounting surface. The laser module of Patent Literature 1 includes a wavelength combining element erected perpendicularly to the mounting surface. With such a configuration, a plurality of light beams having different wavelengths is incident on the wavelength combining element in a state where the slow-axis direction is parallel to the mounting surface, and is emitted from the wavelength combining element. As a result, according to Patent Literature 1, spatially densely filled light beam is generated, and the output of the pumping light beam emitted from the laser module is increased.

[Patent Literature 1] US 2017/0271837 A

As the above wavelength combining element, a diffraction grating or a volume Bragg grating (VBG) in which a refractive index is periodically changed in a glass block may be used. In order to obtain desired diffraction efficiency, it is necessary to accurately adjust the incident angle of light beam incident thereon to a predetermined design value.

In general, the divergence angle in the fast-axis direction of the light beam emitted from the LD is larger than the divergence angle in the slow-axis direction. However, in general, the width in the slow-axis direction of the light beam emitted from the LD is wider than the width in the fast-axis direction, and the beam quality in the slow-axis direction of the light beam is worse than the beam quality in the fast-axis direction. Therefore, after the light beam emitted from the LD passes through a fast-axis collimating lens and a slow-axis collimating lens, the divergence angle of the light beam in the slow-axis direction with respect to the optical axis tends to be larger than the divergence angle of the light beam in the fast-axis direction with respect to the optical axis. In the laser module of Patent Literature 1, after passing through the fast-axis collimating lens and the slow-axis collimating lens, the slow axis of each of the plurality of light beams having different wavelengths is incident on the wavelength combining element in a state of being parallel to a plane passing through the optical axis of each of the light beams incident on the wavelength combining element and the optical axis of each of the light beams emitted from the wavelength combining element, and is emitted from the wavelength combining element. Therefore, when the light beam is incident on the wavelength combining element in a state in which the slow-axis direction is parallel to the plane as in Patent Literature 1, the light beam includes many components incident on the wavelength combining element at an angle different from the design value due to a large divergence angle in the slow-axis direction. For this reason, in the laser module of Patent Literature 1, the diffraction efficiency tends to decrease, and the luminance of the light beam emitted from the laser module tends to decrease.

SUMMARY

One or more embodiments of the present invention provides a laser module capable of emitting high-luminance light beam and a fiber laser device including the laser module.

In one or more embodiments, a laser module of the present invention includes: a first laser diode that emits first light beam; a second laser diode that emits second light beam having a wavelength different from a wavelength of the first light beam; a fast-axis collimating lens that is provided corresponding to each of the first and second laser diodes and collimates a fast-axis direction of light beam emitted from each of the first and second laser diodes; a slow-axis collimating lens that is provided corresponding to each of the first and second laser diodes and collimates a slow-axis direction of the light beam emitted from each of the first and second laser diodes; and a wavelength combining element including a volume Bragg grating (VBG) or a diffraction grating, wherein the first light beam emitted from the first laser diode and transmitted through the fast-axis collimating lens and the slow-axis collimating lens and the second light beam emitted from the second laser diode and transmitted through the fast-axis collimating lens and the slow-axis collimating lens are incident on the wavelength combining element, the wavelength combining element reflects the first light beam in a predetermined direction, superimposes the second light beam on the first light beam, and emits the second light beam in the predetermined direction, and a fast axis of the first beam incident on the wavelength combining element is parallel to a first plane passing through an entire section of the first light beam from an optical element that causes the first light beam to be directly incident on the wavelength combining element to the wavelength combining element and an entire section of the first light beam from the wavelength combining element to an optical element on which the first light beam emitted from the wavelength combining element is directly incident, and a fast axis of the second light beam incident on the wavelength combining element is parallel to a second plane passing through an entire section of the first light beam from an optical element that causes the first light beam to be directly incident on the wavelength combining element to the wavelength combining element and an entire section of the first light beam from the wavelength combining element to an optical element on which the first light beam emitted from the wavelength combining element is directly incident.

When a plane passing through the entire section of the optical axis of the first light beam from the optical element that causes the first light beam to be directly incident on the wavelength combining element to the wavelength combining element and the entire section of the optical axis of the first light beam from the wavelength combining element to the optical element on which the first light beam emitted from the wavelength combining element is directly incident is defined as a reference plane, when the first light beam is incident on the wavelength combining element, a decrease in diffraction efficiency of the first light beam in the wavelength combining element is suppressed as a spreading component with respect to the optical axis in a direction parallel to the reference plane of the first light beam is smaller. Note that the spreading component in the direction perpendicular to the reference plane of the light beam incident on the wavelength combining element has a smaller influence on the interference between the light beam beams emitted from the wavelength combining element than the spreading component in the direction parallel to the reference plane. Since the first plane passes through the entire section of the first light beam from the optical element that causes the first light beam to be directly incident on the wavelength combining element to the wavelength combining element and the entire section of the first light beam from the wavelength combining element to the optical element on which the first light beam emitted from the wavelength combining element is directly incident, the first plane is parallel or close to parallel to the reference plane. Note that the first plane only needs to pass through the first light beam as described above, and is not limited to passing through the optical axis of the first light beam, and may be slightly non-parallel to the plane passing through the optical axis of the first light beam. As described above, in the laser module, in general, the divergence angle of light beam with respect to the optical axis in the fast-axis direction is smaller than the divergence angle of light beam with respect to the optical axis in the slow-axis direction. In this laser module, since the fast axis of the first light beam is parallel to the first plane, the fast axis of the first light beam is parallel or close to parallel to the reference plane. Therefore, in this laser module, the divergence angle of the first light beam in the direction parallel to the reference plane is small, and a decrease in the diffraction efficiency of the first light beam can be suppressed. In addition, since the second plane passes through the entire section of the first light beam from the optical element that causes the first light beam to be directly incident on the wavelength combining element to the wavelength combining element and the entire section of the first light beam from the wavelength combining element to the optical element on which the first light beam emitted from the wavelength combining element is directly incident, the second plane is parallel to or close to parallel to the reference plane. Note that the second plane only needs to pass the first light beam as described above, and is not limited to passing through the optical axis of the first light beam, and may be slightly non-parallel to the plane passing through the optical axis of the first light beam. The second plane may be the same plane as or different from the first plane. However, even if the second plane is different from the first plane, the second plane and the first plane are close to parallel. In this laser module, since the fast axis of the second light beam is parallel to the second plane, the fast axis of the second light beam is parallel or close to parallel to the reference plane. Therefore, in this laser module, the divergence angle of the second light beam in the direction parallel to the reference plane is small, and a decrease in the diffraction efficiency of the second light beam can be suppressed. As described above, according to this laser module, a decrease in diffraction efficiency of the first light beam and the second light beam is suppressed, so that it is possible to increase the density of emitted light beam and emit high-luminance light beam.

In one or more embodiments, the first plane may pass through an optical axis of the first light beam incident on the wavelength combining element and an optical axis of the first light beam reflected by the wavelength combining element.

If the first plane passes through the optical axis of the first light beam as described above, this first plane is parallel to the reference plane. Therefore, it is possible to suppress a decrease in diffraction efficiency as compared with a case where the first plane does not pass through the optical axis of the first light beam.

Further, in one or more embodiments, the second plane may pass through an optical axis of the first light beam incident on the wavelength combining element and an optical axis of the first light beam reflected by the wavelength combining element.

If the second plane passes through the optical axis of the first light beam as described above, the second plane is parallel to the reference plane. Therefore, it is possible to suppress a decrease in diffraction efficiency as compared with a case where the second plane does not pass through the optical axis of the first light beam.

Further, in one or more embodiments, the laser module may include a plurality of the first laser diodes and a plurality of the second laser diodes, each of the first light beams emitted from the plurality of first laser diodes and each of the second light beams emitted from the plurality of second laser diodes is transmitted through the fast-axis collimating lens and the slow-axis collimating lens and is incident on the wavelength combining element, the wavelength combining element reflects each of the first light beams in the predetermined direction, overlaps each of the second light beams with each of the first light beams on a one-to-one basis, and emits each of the second light beams in the predetermined direction, and in each pair of the first light beam and the second light beam superimposed on each other, a fast axis of the first light beam incident on the wavelength combining element is parallel to the first plane in the pair, and a fast axis of the second light beam incident on the wavelength combining element is parallel to the second plane in the pair.

In this case, since the fast axis of each of the plurality of first light beams is parallel to the first plane and the fast axis of each of the plurality of second light beams is parallel to the second plane, a decrease in diffraction efficiency can be suppressed in each of the plurality of first light beams and the plurality of second light beams. Therefore, the density of the emitted light beam as a whole can be increased to emit high-luminance light beam.

Further, in one or more embodiments when the laser module includes a plurality of first laser diodes and a plurality of second laser diodes, fast axes of the respective first light beams incident on the wavelength combining element may be parallel to each other.

In this case, as compared with a case where the fast axes of at least a part of the fast axes of the respective first light beams incident on the wavelength combining element are not parallel to each other, the first light beams can be brought close to each other, and the high-density first light beam can be incident on the wavelength combining element. Therefore, light beam with higher luminance can be emitted.

Further, in one or more embodiments when the laser module has a plurality of first laser diodes and a plurality of second laser diodes, a fast axis of each of the second light beams incident on the wavelength combining element may be parallel to a fast axis of at least one of the first light beams.

In this case, as compared with a case where the fast axis of each of the second light beams incident on the wavelength combining element is not parallel to the fast axis of each of the first light beams, the degree of overlap between the first light beam and the second light beam can be increased, and the density of the first light beam and the second light beam incident on the wavelength combining element can be increased. Therefore, light beam with higher luminance can be emitted.

Further, in one or more embodiments when the laser module includes a plurality of first laser diodes and a plurality of second laser diodes, fast axes of the respective second light beams incident on the wavelength combining element may be parallel to each other.

In this case, as compared with a case where the fast axes of at least a part of the fast axes of the respective second light beams incident on the wavelength combining element are not parallel to each other, the second light beams can be brought close to each other, and the high-density second light beam can be incident on the wavelength combining element. Therefore, light beam with higher luminance can be emitted.

Further, wavelengths of light beam emitted from the first laser diode and the second laser diode may be 970 nm or more and 982 nm or less.

When a laser module is used in a fiber laser device, ytterbium (Yb) may be added as an active element to a core of an amplification optical fiber through which light beam emitted from the laser module propagates. One of peak wavelength bands in an absorption spectrum of light beam absorbed by the ytterbium is approximately 970 nm or more and 982 nm or less. Therefore, when the wavelength of light beam emitted from the plurality of laser diodes is 970 nm or more and 982 nm or less, light beam can be effectively absorbed by the amplification optical fiber when the laser module is connected to the amplification optical fiber to which ytterbium is added.

In one or more embodiments when the wavelengths of the light beam emitted from the first laser diode and the second laser diode are 970 nm or more and 982 nm or less, a wavelength of the first light beam and a wavelength of the second light beam may be on opposite sides with respect to 976 nm, and a difference between the wavelength of the first light beam and the wavelength of the second light beam is within 2 nm.

When the difference between the wavelength of the first light beam and the wavelength of the second light beam is as small as described above, the absorption efficiency of both the first light beam and the second light beam into ytterbium is high. Therefore, when this laser module is connected to the amplification optical fiber to which ytterbium is added, the pumping efficiency in the amplification optical fiber can be further increased.

In addition, in one or more embodiments, an incident angle of the first light beam to the wavelength combining element and an incident angle of the second light beam to the wavelength combining element may be each 3° or more.

When the incident angle is 3° or more, the first light beam and the second light beam are easily emitted from the wavelength combining element in the predetermined direction as compared with the case where the incident angle is less than 3°. For this reason, it is easy to form a layout that can prevent the first light beam and the second light beam emitted from the wavelength combining element from being incident on an optical element different from the optical element on which the light beam should be incident originally.

In addition, the wavelength combining element may be a VBG having apodization.

According to such a configuration, when side lobes are generated in the distribution of the diffraction efficiency of the VBG with respect to the wavelength of light beam incident on the VBG, the side lobes can be reduced. As a result, even light beams having short wavelength intervals can be combined without being interfered with side lobes.

In addition, in one or more embodiments, total power of the first light beam incident on the wavelength combining element and traveling in the predetermined direction with respect to total power of the first light beam reflected by the wavelength combining element may be 80% or more, and total power of the second light beam incident on the wavelength combining element and traveling in the predetermined direction with respect to total power of the second light beam emitted from the wavelength combining element is 80% or more.

According to such a configuration, since 80% or more of each of the first and second light beams incident on the wavelength combining element is emitted in the predetermined direction, the density of the light beam emitted from the wavelength combining element is further increased.

In addition, in one or more embodiments, a fiber laser device of the present invention includes: the laser module according to any one of the above; and an amplification optical fiber in which light beam emitted from the laser module is incident, and an active element pumped by the light beam is added to a core.

Since this fiber laser device includes the laser module according to any one of the above, pumping light beam falling within the peak wavelength band of the active element of the amplification optical fiber can be incident on the amplification optical fiber with high density and high luminance. Therefore, the pumping light beam propagating through the amplification optical fiber has high density and high luminance, and the absorption efficiency of the pumping light beam in the amplification optical fiber can be enhanced.

In the fiber laser device, a wavelength of the first light beam and a wavelength of the second light beam may be positioned on a low wavelength side and a high wavelength side across a peak wavelength in an absorption spectrum of light beam absorbed by the active element.

Since the laser diodes mounted on the same laser module are mounted on the same laser module, their external environments and driving conditions are substantially the same. For this reason, the wavelength shift directions of the light beams emitted from the laser diodes tend to be the same direction, and the wavelength shift directions tend to shift toward the long wavelength side or the short wavelength side. Therefore, if the wavelength of the first light beam and the wavelength of the second light beam are positioned on the low wavelength side and the high wavelength side with the peak wavelength interposed therebetween, in a case where the light beam emitted from each laser diode is shifted in wavelength, for example, to the long wavelength side due to a temperature change of the fiber laser device or the like, the wavelength of the light beam whose wavelength is positioned on the low wavelength side with the peak wavelength interposed therebetween among the first light beam and the second light beam may be shifted to a wavelength at which the absorption rate to the active element increases, and the wavelength of the light beam positioned on the high wavelength side may be shifted to a wavelength at which the absorption rate to the active element decreases. Therefore, when the wavelength shift occurs, the absorption rate of the first light beam to the active element and the absorption rate of the second light beam to the active element can be balanced as a whole, and a change in behavior of the laser device due to a change in the absorption rate of the pumping light beam to the active element can be suppressed.

In one or more embodiments, when the wavelength of the first light beam and the wavelength of the second light beam are positioned on a low wavelength side and a high wavelength side with a peak wavelength in an absorption spectrum of light beam absorbed by the active element interposed therebetween, an absorption rate of the first light beam to the active element may be equal to an absorption rate of the second light beam to the active element at a part of a use temperature of the fiber laser device.

When there is a difference between the absorption rate of the first light beam to the active element and the absorption rate of the second light beam to the active element, it is necessary to design the addition amount of the active element, the length of the amplification optical fiber, and the like in consideration of the difference in absorption rate. On the other hand, as described above, if the absorption rate of the first light beam to the active element and the absorption rate of the second light beam to the active element are the same at a part of the use temperature of the fiber laser device, the addition amount of the active element and the like can be determined in accordance with a single absorption rate, and the laser device can be easily designed.

As described above, according to one or more embodiments of the present invention, it is possible to provide a laser module capable of emitting high-luminance light beam and a fiber laser device including the laser module.

BRIEF DESCRIPTION OF DRAWINGS

FIG. 9 is a plan view illustrating a laser module according to one or more embodiments of the present invention from the same viewpoint as FIG. 3.

FIG. 12 is a view illustrating a third modification of the laser module of one or more embodiments of the present invention from the same viewpoint as FIG. 7.

DETAILED DESCRIPTION

Hereinafter, modes for implementing a laser module and a fiber laser device according to one or more embodiments of the present invention will be illustrated together with the accompanying drawings. The embodiments exemplified below are intended to facilitate understanding of the present invention and are not intended to limit the present invention. Embodiments of the present invention can be modified and improved from the following embodiments without departing from the gist thereof. In addition, in the present specification, dimensions of each member may be exaggerated for easy understanding.

Figure 1:
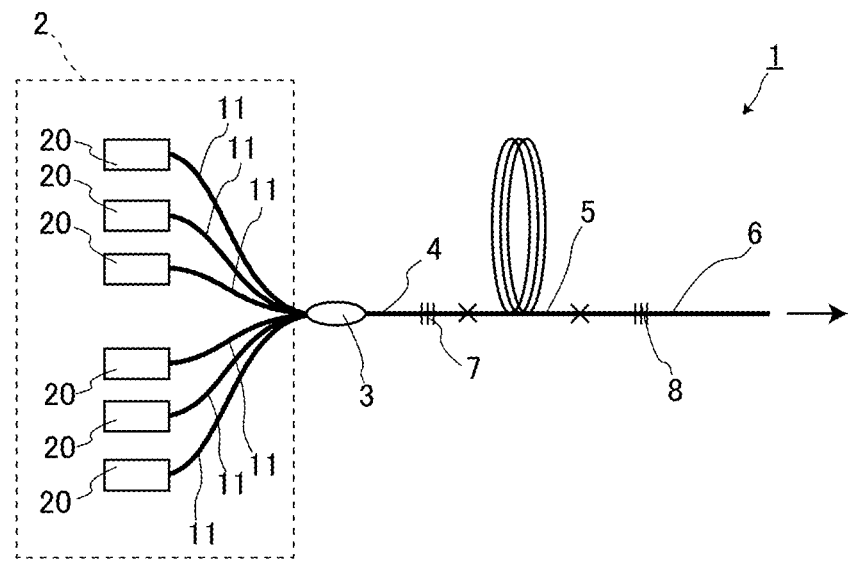
FIG. 1 is a diagram illustrating a configuration of a fiber laser device according to one or more embodiments of the present invention.

FIG. 1 is a diagram illustrating a configuration of a fiber laser device according to one or more embodiments. As illustrated in FIG. 1, the fiber laser device 1 of one or more embodiments mainly includes a pumping light source 2, an optical combiner 3, an amplification optical fiber 5, an optical fiber 4 connected to one side of the amplification optical fiber 5, a first fiber Bragg grating (FBG) 7 provided in the optical fiber 4, an optical fiber 6 connected to the other side of the amplification optical fiber 5, and a second FBG 8 provided in the optical fiber 6. In the fiber laser device 1, the amplification optical fiber 5, the first FBG 7, and the second FBG 8 constitute a resonator. A general use temperature of the fiber laser device 1 is 0° C. or more and 60° C. or less, but the fiber laser device 1 may be used at a temperature lower or higher than a temperature range of 0° C. or more and 60° C. or less.

Figure 2:
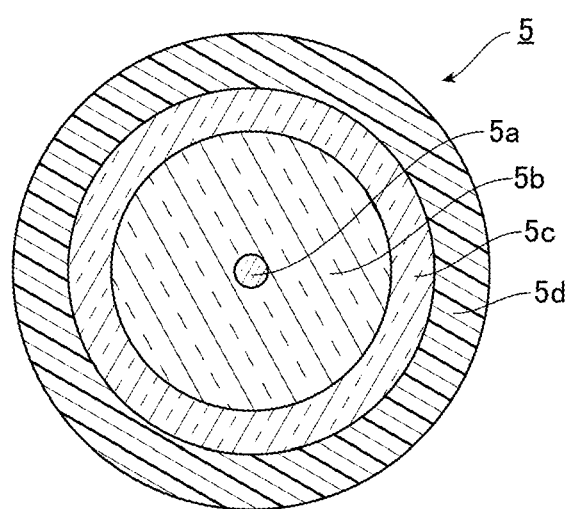
FIG. 2 is a view illustrating a state of a cross-section perpendicular to a longitudinal direction of the amplification optical fiber illustrated in FIG. 1.

FIG. 2 is a diagram illustrating a cross-section perpendicular to the longitudinal direction of the amplification optical fiber 5 illustrated in FIG. 1. As illustrated in FIG. 2, the amplification optical fiber 5 mainly includes a core 5a, an inner cladding 5b surrounding the outer peripheral surface of the core 5a without a gap, an outer cladding 5c covering the outer peripheral surface of the inner cladding 5b, and a covering layer 5d covering the outer cladding 5c, and has a so-called double cladding structure. The refractive index of the inner cladding 5b is lower than the refractive index of the core 5a, and the refractive index of the outer cladding 5c is lower than the refractive index of the inner cladding 5b.

Examples of the material constituting the core 5a include quartz doped with an element such as germanium (Ge) that increases the refractive index and an active element such as ytterbium (Yb) that is pumped by a pumping light beam emitted from the pumping light source 2. In addition to these elements, aluminum (Al), phosphorus (P), or the like may be added as necessary. Examples of such an active element include a rare earth element, and examples of the rare earth element include thulium (Tm), cerium (Ce), neodymium (Nd), europium (Eu), erbium (Er), and the like in addition to Yb described above. Furthermore, examples of the active element include bismuth (Bi) in addition to the rare earth element. In one or more embodiments, ytterbium is added as an active element.

Examples of the material constituting the inner cladding 5b include pure quartz to which no dopant is added. Incidentally, an element such as fluorine (F) for reducing the refractive index may be added to the material of the inner cladding 5b. The outer cladding 5c is made of resin or quartz. Examples of such a resin include an ultraviolet curable resin, and examples of quartz include quartz to which a dopant such as fluorine (F) for reducing the refractive index so that the refractive index becomes lower than that of the inner cladding 5b is added. Examples of the material constituting the covering layer 5d include an ultraviolet curable resin, and when the outer cladding 5c is a resin, the material is an ultraviolet curable resin different from the resin constituting the outer cladding.

The optical fiber 4 connected to one side of the amplification optical fiber 5 mainly includes a core to which an active element is not added, an inner cladding surrounding the outer peripheral surface of the core without a gap, an outer cladding covering the outer peripheral surface of the inner cladding, and a covering layer covering the outer cladding. The diameter, refractive index, and the like of the core of the optical fiber 4 are substantially the same as the diameter, refractive index, and the like of the core 5a of the amplification optical fiber 5 except that no active element is added. The core of the optical fiber 4 is connected to the core 5a of the amplification optical fiber 5, and the inner cladding of the optical fiber 4 is connected to the inner cladding 5b of the amplification optical fiber 5. The core of the optical fiber 4 is provided with a first FBG 7 as a first mirror. Thus, the first FBG 7 is optically coupled to the core 5a of the amplification optical fiber 5 on one side of the amplification optical fiber 5. The first FBG 7 is configured such that a portion where the refractive index periodically increases is repeated along the longitudinal direction of the optical fiber 4, and this period is adjusted to reflect light beam of at least a part of the wavelengths of light beam emitted by the active element of the amplification optical fiber 5 in the pumped state. The first FBG 7 has higher reflectance than the second FBG 8 to be described later, and reflects 99% or more of light beams having a desired wavelength of the light beam emitted by the active element, for example. When the active element is ytterbium as described above, the wavelength of light beam reflected by the first FBG 7 is, for example, 1070 nm.

The optical fiber 6 connected to the other side of the amplification optical fiber 5 mainly includes a core to which an active element is not added, a cladding surrounding the outer peripheral surface of the core without a gap, and a covering layer covering the outer peripheral surface of the cladding. The core of the optical fiber 6 is connected to the core 5a of the amplification optical fiber 5, and the cladding of the optical fiber 6 is connected to the inner cladding 5b of the amplification optical fiber 5. The core of the optical fiber 6 is provided with a second FBG 8 as a second mirror. Thus, the second FBG 8 is optically coupled to the core 5a of the amplification optical fiber 5 on the other side of the amplification optical fiber 5. The second FBG 8 is configured such that a portion having a high refractive index is repeated at a constant period along the longitudinal direction of the optical fiber 6, and light beam having at least a part of wavelengths among the light beams reflected by the first FBG 7 is reflected at a lower reflectance than the first FBG 7. The second FBG 8 reflects light beam of at least a part of the wavelengths of the light beam reflected by the first FBG 7 at a reflectance of, for example, 5% to 50%. In one or more embodiments, nothing is particularly connected to the other end of the optical fiber 6 on the side opposite to the amplification optical fiber 5 side, but a glass rod or the like having a diameter larger than the diameter of the core of the optical fiber 6 may be connected as a part of a processing head.

The pumping light source 2 includes a plurality of laser modules 20 and an optical fiber 11 connected to each laser module 20. The core of each optical fiber 11 is connected to the inner cladding of the optical fiber 4 via the optical combiner 3. Therefore, the core of the optical fiber 11 through which the pumping light beam emitted from each laser module 20 propagates and the inner cladding 5b of the amplification optical fiber 5 are optically coupled via the inner cladding of the optical fiber 4.

Figure 3:
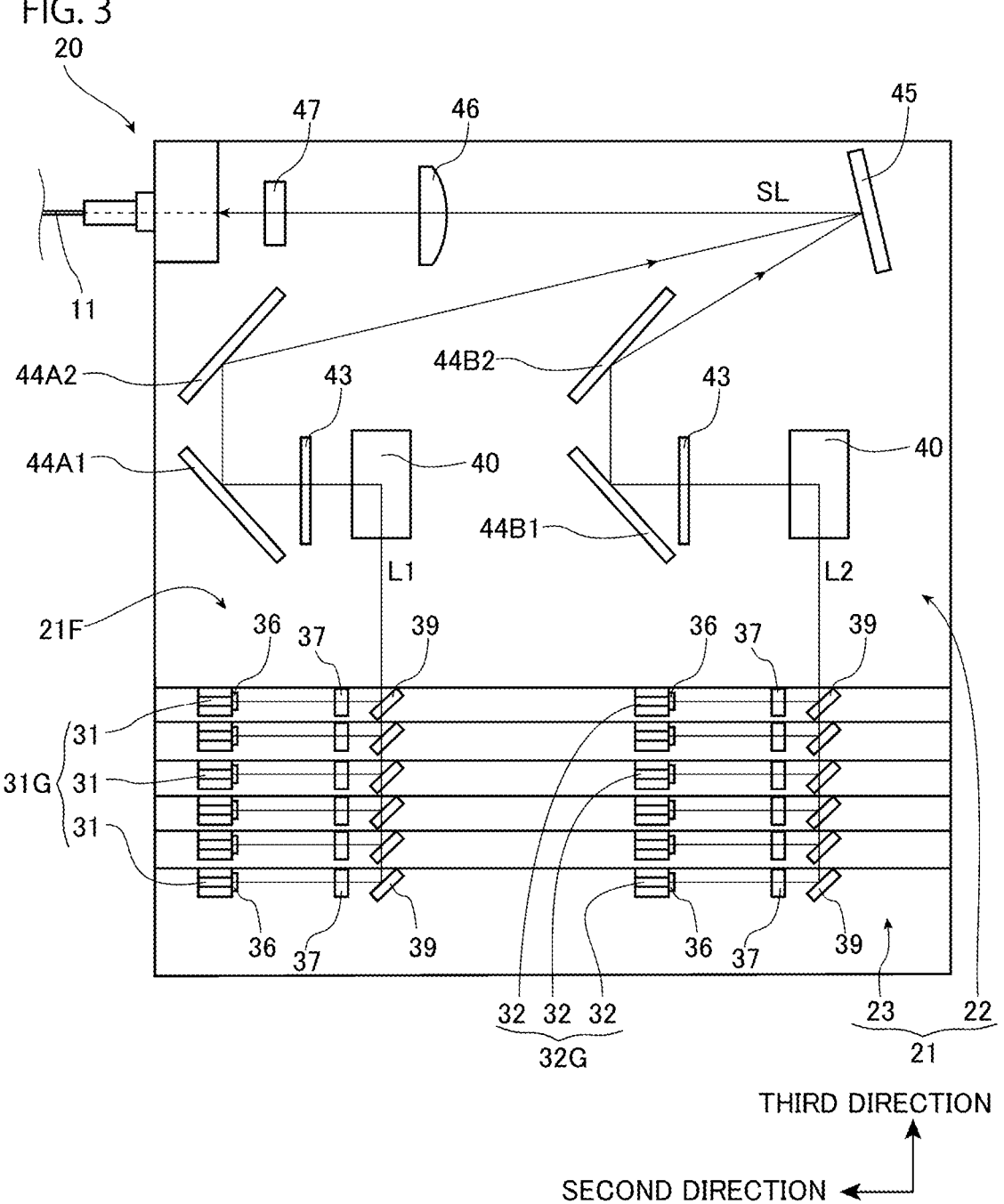
FIG. 3 is a plan view of the laser module according to one or more embodiments of the present invention as viewed from a direction perpendicular to an active layer of a laser diode.

FIG. 3 is a plan view illustrating the laser module 20. As illustrated in FIG. 3, the laser module 20 includes an optical element group to be described later, a mounting substrate 21 on which the optical element group is mounted, and a lid (not illustrated) that covers the mounting substrate 21 and houses the optical element group together with the mounting substrate 21.

The mounting substrate 21 includes a flat plate portion 22 and a stepped portion 23 formed in a stepped shape. The optical fiber 11 is connected to the vicinity of the edge of the flat plate portion 22 on the side opposite to the stepped portion 23 side.

The stepped portion 23 is configured to form a step in a first direction perpendicular to the flat plate portion 22. Assuming that the surface of the flat plate portion 22 is the 0th step, in one or more embodiments, the stepped portion 23 has six steps along the first direction. The first step of the stepped portion 23 is the step closest to the flat plate portion 22 and is the lowest step of the stepped portion 23. As the number of steps increases, the distance from the flat plate portion 22 increases and the height away from the surface of the flat plate portion 22 increases. Note that the number of steps of the stepped portion 23 is not limited to 6. Since the surface of each step is parallel to the surface of the flat plate portion 22, and the optical element group is placed on the surface of the flat plate portion 22 and the surface of each step, the surface of the flat plate portion 22 and the surface of each step may be collectively referred to as a mounting surface 21F. A direction perpendicular to the mounting surface 21F is the first direction. The surface of each step is formed in a band shape parallel to each other, and the longitudinal direction of each step is along a second direction which is one of directions perpendicular to the first direction. A direction perpendicular to both the first direction and the second direction is a third direction.

The optical element group mounted on the mounting surface 21F includes a plurality of laser diodes (LD), a plurality of fast-axis collimating lenses 36, a plurality of slow-axis collimating lenses 37, a plurality of mirrors 39, two optical rotating elements 40, two wavelength stabilizing elements 43, a pair of mirrors 44A1 and 44A2, a pair of mirrors 44B1 and 44B2, a wavelength combining element 45, a first condenser lens 46, and a second condenser lens 47. In this optical element group, the two optical rotating elements 40, the two wavelength stabilizing elements 43, the pair of mirrors 44A1 and 44A2, the pair of mirrors 44B1 and 44B2, the wavelength combining element 45, the first condenser lens 46, and the second condenser lens 47 are arranged on the flat plate portion 22. The plurality of LDs, the plurality of fast-axis collimating lenses 36, the plurality of slow-axis collimating lenses 37, and the plurality of mirrors 39 are arranged in the stepped portion 23.

The plurality of LDs includes a first LD group 31G including a plurality of first LDs 31 arranged on one side with respect to the center of the mounting substrate 21 in the second direction, and a second LD group 32G including a plurality of second LDs 32 arranged on the other side. each of the first LD 31 and the second LD 32 is disposed on the surface of each step of the stepped portion 23. In addition, each of the first LD 31 and the second LD 32 has a Fabry-Perot structure formed by laminating a plurality of semiconductor layers including an active layer, and is arranged such that the active layer is parallel to the mounting surface 21F. The first LD 31 emits light beam in the second direction toward the second LD 32 disposed in the same step, and the second LD 32 emits light beam in the second direction toward the opposite side to the first LD 31 disposed in the same step. Therefore, the fast-axis direction of the light beam emitted from the first LD 31 and the second LD 32 is parallel to the first direction. The slow-axis direction of the light beam emitted from the first LD 31 and the second LD 32 is parallel to the mounting surface 21F and is parallel to the third direction perpendicular to the second direction.

The first LD 31 and the second LD 32 emit light beam in a wavelength band of 970 nm or more and 982 nm or less, more specifically, emit light beam in a wavelength band of 970 nm or more and 980 nm or less. The wavelength of the first light beam L1 emitted from the first LD 31 is different from the wavelength of the second light beam L2 emitted from the second LD 32. In one or more embodiments, the interval between these wavelengths is, for example, within 2 nm, the wavelength of the first light beam L1 is, for example, approximately 975 nm, and the wavelength of the second light beam L2 is, for example, approximately 977 nm.

The plurality of fast-axis collimating lenses 36 are provided in one-to-one correspondence with the plurality of LDs, and are provided at the same step as the corresponding LDs. The fast-axis collimating lens 36 is provided in the vicinity of the emission surfaces of the LDs 31 and 32, and collimates light beam of a component spreading in the fast-axis direction emitted from the LDs 31 and 32.

The plurality of slow-axis collimating lenses 37 are provided in one-to-one correspondence with the plurality of LDs, and are provided at the same step as the corresponding LDs. The slow-axis collimating lens 37 is aligned with the fast-axis collimating lens 36 along the second direction, and collimates light beam of a component spreading in the slow-axis direction that has passed through the fast-axis collimating lens 36.

The plurality of mirrors 39 are provided in one-to-one correspondence with the plurality of LDs, and are provided at the same step as the corresponding LDs. The mirror 39 is aligned with the fast-axis collimating lens 36 and the slow-axis collimating lens 37 along the second direction, and has a reflecting surface that reflects light beam transmitted through the slow-axis collimating lens 37. This reflecting surface is inclined by approximately 45° with respect to the second direction. Therefore, the light beam reflected by the mirror 39 propagates along the third direction toward the flat plate portion 22.

Figure 4:
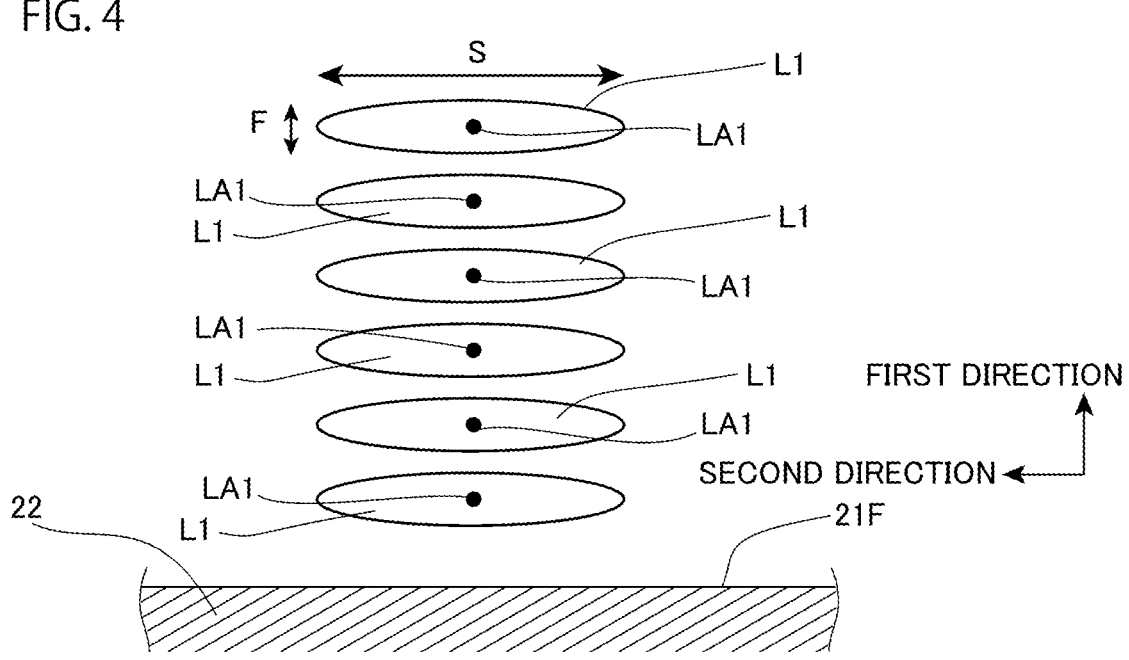
FIG. 4 is a view illustrating a state of light beam incident on an optical rotating element.

FIG. 4 is a view illustrating a state of the first light beam L1 at a time point when the first light beam L1 is emitted from each of the first LDs 31, reflected by the mirror 39, and reaches the boundary between the stepped portion 23 and the flat plate portion 22. In FIG. 4, each of the first light beams L1 is illustrated in a cross-section perpendicular to the mounting surface 21F and orthogonal to the third direction. As illustrated in FIG. 4, the first light beam L1 emitted from each of the first LDs 31 has an elliptical shape whose major axis is parallel to the mounting surface 21F. FIG. 4 illustrates a state of the first light beam L1 after being reflected by the mirror 39. Reference sign S indicates a slow-axis direction of the first light beam L1, and reference sign F indicates a fast-axis direction of the first light beam L1. The fast-axis direction is parallel to the first direction as described above. Each of the first light beams L1 is arranged in parallel along the first direction which is the fast-axis direction by the above-described 6-step stepped portion 23. In one or more embodiments, the first light beams L1 have an elliptical shape having substantially the same size, and the optical axes LA1 are arranged on a straight line along the first direction.

The state of the second light beam L2 emitted from the second LD group 32G, reflected by the mirror 39, and reaching the boundary between the stepped portion 23 and the flat plate portion 22 is similar to the state of the first light beam L1 illustrated in FIG. 4. Therefore, the six second light beams L2 have an elliptical shape having substantially the same size, and the optical axes LA2 are arranged on a straight line along the first direction.

As illustrated in FIG. 3, one optical rotating element 40 of the two optical rotating elements 40 is provided on each optical path of the first light beam L1, and is arranged along the third direction together with the mirror 39 corresponding to the first LD group 31G. The other optical rotating element 40 is provided on each optical path of the second light beam L2, and is arranged along the third direction together with the mirror 39 corresponding to the second LD group 32G. These optical rotating elements 40 have the same configuration. Therefore, the one optical rotating element 40 will be described.

Figure 5:
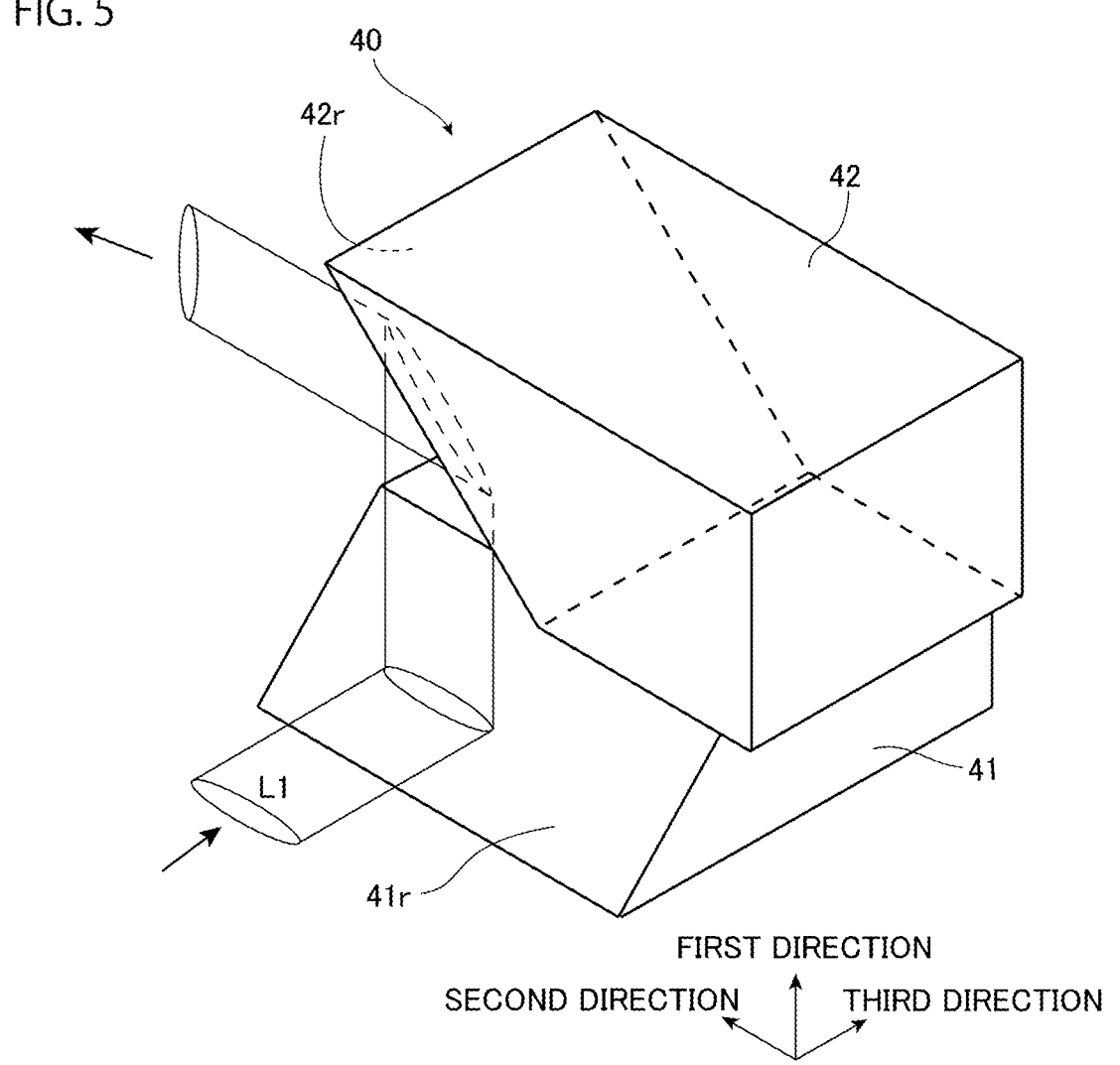
FIG. 5 is a perspective view illustrating an example of the optical rotating element illustrated in FIG. 3.

FIG. 5 is a perspective view illustrating an example of the optical rotating element 40. Note that, in FIG. 5, one of the respective first light beams L1 incident on the optical rotating element 40 is illustrated in order to avoid complication of the drawing. As illustrated in FIG. 5, the optical rotating element 40 includes a first reflecting member 41 disposed on the lower side in the first direction and a second reflecting member 42 disposed on the upper side. A reflecting surface 41r is provided on the stepped portion 23 side in the third direction of the first reflecting member 41, and the reflecting surface 41r is inclined by approximately 45° with respect to the surface of the flat plate portion 22. A reflecting surface 42r is provided immediately above the reflecting surface 41r of the second reflecting member 42, and the reflecting surface 42r is inclined by approximately 45° with respect to the surface of the flat plate portion 22. The reflecting surface 42r is a surface of the second reflecting member 42 on the side opposite to the other optical rotating element 40 side. Therefore, when the first light beam L1 reflected by the mirror 39 and propagated in the third direction is incident on the reflecting surface 41r of the first reflecting member 41, the first light beam L1 is reflected upward in the first direction by the reflecting surface 41r. As a result, the fast axis of the first light beam L1 becomes parallel to the third direction. At this stage, the slow axis of the first light beam L1 remains parallel to the second direction. In this state, each of the first light beams L1 propagates upward in the first direction and is incident on the reflecting surface 42r of the second reflecting member 42 positioned upward.

Figures 6, 7:
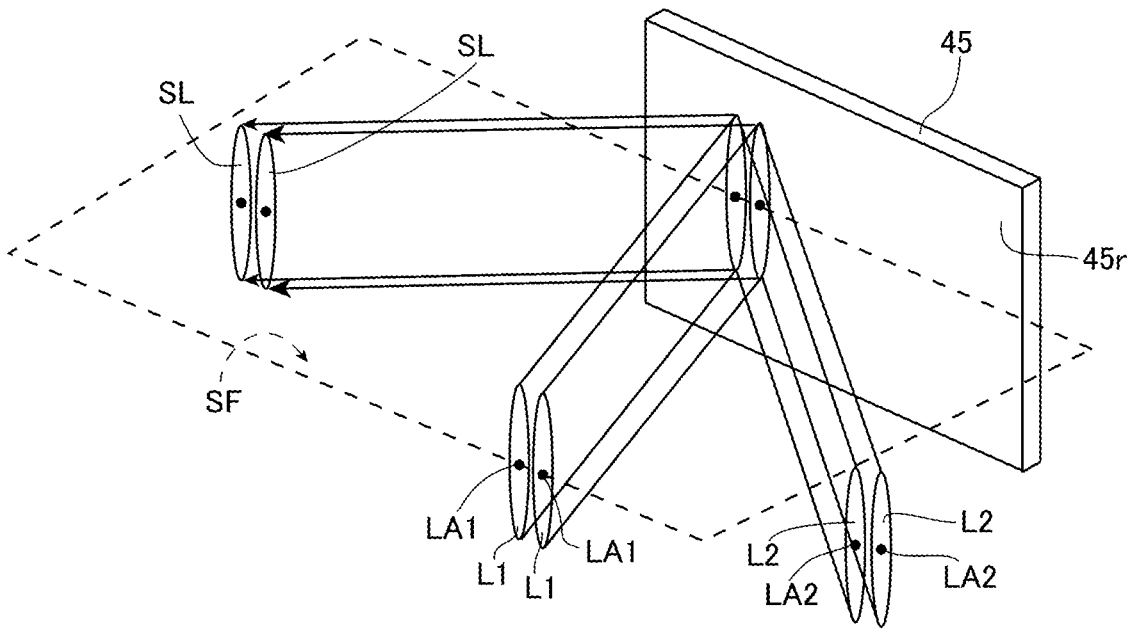
FIG. 6 is a view illustrating a state of light beam emitted from the optical rotating element.
FIG. 7 is a view schematically illustrating a state in the vicinity of the wavelength combining element illustrated in FIG. 3.

As described above, the reflecting surface 42r is inclined by 45°. Therefore, each of the first light beams L1 reflected by the reflecting surface 41r is reflected by the reflecting surface 42r and propagates to the side opposite to the other optical rotating element 40 side in the second direction. FIG. 6 is a diagram illustrating a state of the first light beam L1 reflected by the reflecting surface 42r. In FIG. 6, each of the first light beams L1 is illustrated in a cross-section perpendicular to the mounting surface 21F and orthogonal to the second direction. As illustrated in FIG. 6, each of the first light beams L1 emitted from the optical rotating element 40 is reflected by the reflecting surface 42r, so that the slow axis is parallel to the first direction and the fast axis is parallel to the third direction. Furthermore, in one or more embodiments, after being emitted from the optical rotating element 40, each of the first light beams L1 has an elliptical shape having substantially the same size, and the optical axes LA1 are arranged on a straight line along the third direction parallel to the mounting surface 21F. Therefore, in one or more embodiments, the heights in the first direction of the optical axes LA1 of the respective first light beams L1 emitted from the optical rotating element 40 coincide with each other.

Each of the second light beams L2 is reflected by the other optical rotating element 40 in the same manner as the first light beam L1, and enters the same state as the first light beam illustrated in FIG. 6. In one or more embodiments, after the light beam is emitted from the optical rotating element 40, the height of the optical axis of the second light beam L2 in the first direction coincides with the height of the optical axis LA1 of each of the first light beams L1 in the first direction.

One of the two wavelength stabilizing elements 43 is disposed on each optical path of the first light beam L1 reflected by the one optical rotating element 40, and is aligned with the optical rotating element 40 along the second direction. Therefore, the first light beam L1 reflected by the optical rotating element 40 is incident on one wavelength stabilizing element 43. The other wavelength stabilizing element 43 is disposed on each optical path of the second light beam L2 reflected by the other optical rotating element 40, and is aligned with the optical rotating element 40 along the second direction. Therefore, the second light beam L2 reflected by the optical rotating element 40 is incident on the other wavelength stabilizing element 43.

In one or more embodiments, one wavelength stabilizing element 43 is an optical element that transmits a part of light beam having a wavelength of approximately 975 nm and reflects the other part, and is a VBG or a diffraction grating in one or more embodiments. As described above, the wavelength of the first light beam L1 is approximately 975 nm. Therefore, the other part of the first light beam L1 incident on the wavelength stabilizing element 43 is reflected by the wavelength stabilizing element 43 and returns to the first LD group 31G. As described above, the wavelength stabilizing element 43 and the first LD group 31G constitute a resonator, and the gain and the loss in the resonator become equal, so that the first light beam L1 having a wavelength of approximately 975 nm enters an oscillation state.

In one or more embodiments, the other wavelength stabilizing element 43 is an optical element that transmits a part of light beams having a wavelength of approximately 977 nm and reflects the other part, and is a VBG or a diffraction grating. Therefore, a resonator is configured as the wavelength stabilizing element 43 and the second LD group 32G, and the second light beam L2 having a wavelength of approximately 977 nm enters an oscillation state.

Among the pair of mirrors 44A1 and 44A2, the mirror 44A1 reflects the plurality of first light beams L1 emitted from one wavelength stabilizing element 43 toward the mirror 44A2. The mirror 44A2 reflects the first light beam L1 reflected by the mirror 44A1 toward the wavelength combining element 45. Among the pair of mirrors 44B1 and 44B2, the mirror 44B1 reflects the plurality of second light beams L2 emitted from the other wavelength stabilizing element 43 toward the mirror 44B2. The mirror 44B2 reflects the second light beam L2 reflected by the mirror 44B1 toward the wavelength combining element 45. Thus, the plurality of first light beams L1 propagates toward the wavelength combining element 45 in a state where the fast axis is parallel to the mounting surface 21F and the slow axis is parallel to the first direction perpendicular to the mounting surface 21F. Similarly, the plurality of second light beams L2 propagate toward the wavelength combining element 45 in a state where the fast axis is parallel to the mounting surface 21F and the slow axis is parallel to the first direction perpendicular to the mounting surface 21F.

In one or more embodiments, the first light beams L1 reflected by the mirrors 44A1 and 44A2 have an elliptical shape having substantially the same size with the major-axis direction parallel to the first direction, and the heights of the optical axes LA1 from the surface of the flat plate portion 22 in the first direction coincide with each other. Similarly, the second light beams L2 reflected by the mirrors 44B1 and 44B2 have an elliptical shape having substantially the same size with the major-axis direction parallel to the first direction, and the heights of the optical axes from the surface of the flat plate portion 22 in the first direction coincide with each other. In addition, the height of the optical axis LA1 of the first light beam L1 reflected by the mirrors 44A1 and 44A2 and the height of the optical axis LA2 of the second light beam L2 reflected by the mirrors 44B1 and 44B2 coincide with each other.

The wavelength combining element 45 is arranged in the vicinity of the edge of the flat plate portion 22 on the side opposite to the stepped portion 23 and on the side opposite to the optical fiber 11 side. In one or more embodiments, the wavelength combining element 45 is a diffraction grating, and a plurality of grooves (not illustrated) extending substantially along the slow-axis direction of each of the first light beam L1 and the second light beam L2 immediately before being incident on the wavelength combining element 45 are formed in a predetermined pattern in the wavelength combining element 45. Therefore, the wavelength combining element 45 of one or more embodiments has the reflecting surface 45r, and a plurality of grooves extending substantially along the first direction is formed in the reflecting surface 45r. Examples of such a diffraction grating include a reflective diffraction grating, a blazed diffraction grating, and a holographic diffraction grating.

The first light beam L1 reflected by the mirror 44A2 is incident on the wavelength combining element 45. Therefore, the mirror 44A2 is an optical element that causes the first light beam L1 to be directly incident on the wavelength combining element 45. The second light beam L2 reflected by the mirror 44B2 is incident on the wavelength combining element 45. Therefore, the mirror 44B2 is an optical element that causes the second light beam L2 to be directly incident on the wavelength combining element 45.

FIG. 7 is a diagram illustrating a state in the vicinity of the wavelength combining element 45. As illustrated in FIG. 7, the wavelength combining element 45 is along the first direction and is inclined at a predetermined angle with respect to the second direction and the third direction. In one or more embodiments, a first incident angle at which each of the first light beams L1 is incident on the wavelength combining element 45 and a second incident angle at which each of the second light beams L2 is incident on the wavelength combining element 45 are different from each other. Each of the first light beam L1 and each of the second light beams L2 are incident on substantially the same position in the wavelength combining element 45, each of the second light beams L2 overlaps each of the first light beams L1, and the first light beam L1 and the second light beam L2 are superimposed on a one-to-one basis to become the combined light beam SL. Therefore, each of the combined light beams SL includes the first light beam L1 and the second light beam L2. In FIG. 7, two first light beams L1 and two second light beams L2 are illustrated in order to prevent the drawing from becoming complicated.

The wavelength combining element 45 is formed such that when the first light beam L1 is incident at the first incident angle and the second light beam L2 is incident at the second incident angle, the first light beam L1 and the second light beam L2 are reflected and emitted in substantially the same predetermined direction. In one or more embodiments, the predetermined direction is a direction toward the optical fiber 11 along the second direction. Therefore, each of the first light beams L1 and each of the second light beams L2 incident on the wavelength combining element 45 is reflected toward the optical fiber 11 along the second direction in the wavelength combining element 45. The first light beam L1 and the second light beam L2 are emitted from the wavelength combining element 45 by reflection. The combined light beam SL including the first light beam L1 and the second light beam L2 emitted from the wavelength combining element 45 is incident on the first condenser lens 46. Therefore, the first condenser lens 46 is an optical element on which the first light beam L1 and the second light beam L2 emitted from the wavelength combining element 45 are directly incident. In one or more embodiments, the fast axis of each of the first light beams L1 emitted from the wavelength combining element 45 is parallel to the third direction parallel to the mounting surface 21F, and the heights of the respective optical axes LA1 in the first direction coincide with each other. Similarly, the fast axis of each of the second light beams L2 emitted from the wavelength combining element 45 is parallel to the third direction parallel to the mounting surface 21F, and the heights of the optical axes LA2 in the first direction coincide with each other. In addition, the heights in the first direction of the optical axes LA1 and LA2 of the light beams L1 and L2 emitted from the wavelength combining element 45 coincide with each other. In this way, a plurality of combined light beams SL in which one first light beam L1 and one second light beam L2 are superimposed is formed, and these combined light beams SL propagate toward the optical fiber 11.

Here, the first light beam L1 and the second light beam L2 superimposed on each other are paired to define, in each pair, a first plane passing through the entire section of the optical axis LA1 of the first light beam L1 from the mirror 44A2, which is an optical element that causes the first light beam L1 to be directly incident on the wavelength combining element 45, to the wavelength combining element 45, and the entire section of the optical axis LA1 of the first light beam L1 from the wavelength combining element 45 to the first condenser lens 46, which is an optical element on which the first light beam L1 emitted from the wavelength combining element 45 is directly incident. The first plane is a plane determined for each of the first light beams L1. In one or more embodiments, each of the first planes determined for the respective first light beams L1 can be parallel to the mounting surface 21F. In this case, the fast axis of each of the first light beams L1 incident on the wavelength combining element 45 is parallel to the first plane in the pair. In addition, as described above, since the heights of the optical axes LA1 of the respective first light beams L1 incident on the wavelength combining element 45 coincide with each other, the heights of the respective first planes are the same. Therefore, in one or more embodiments, each of the first planes can be included in one planar reference plane SF overlapping each other. In FIG. 7, only a partial region of the reference plane SF is illustrated.

Among the first light beams L1 and the second light beams L2, for each pair of the first light beam L1 and the second light beam L2 superimposed on each other, a second plane passing through the entire section of the optical axis LA1 of the first light beam L1 from the mirror 44A2 to the wavelength combining element 45 and the entire section of the optical axis LA1 of the first light beam L1 from the wavelength combining element 45 to the first condenser lens 46 is determined. The second plane is a plane determined for each of the second light beams L2. In one or more embodiments, each of the second planes determined for the respective second light beams L2 can be parallel to the mounting surface 21F. In this case, the fast axis of each of the second light beams L2 incident on the wavelength combining element 45 is parallel to the second plane in the pair. As described above, the height of the optical axis LA2 of each of the second light beams L2 incident on the wavelength combining element 45 coincides with the height of the optical axis LA1 of each of the first light beams L1 incident on the wavelength combining element 45, and the height of the optical axis LA2 of each of the second light beams L2 reflected by the wavelength combining element 45 coincides with the height of the optical axis LA1 of each of the first light beams L1 reflected by the wavelength combining element 45. Therefore, the height of each of the second planes can be made the same as the height of the first plane. Therefore, in one or more embodiments, each of the second planes can be included in the reference plane SF.

The first incident angle and the second incident angle may be, for example, 3° or more and less than 90°, or may be 3° or more and 45° or less. When the incident angle is 3° or more, the first light beam L1 and the second light beam L2 are easily emitted from the wavelength combining element 45 in a desired direction as compared with the case where the incident angle is less than 3°. Therefore, it is easy to form a layout that can prevent the first light beam L1 and the second light beam L2 emitted from the wavelength combining element 45 from being incident on an optical element different from the optical element on which the light should be incident originally.

In addition, the wavelength combining element 45 of one or more embodiments is configured such that total power of the first light beam L1 incident on the wavelength combining element 45 and traveling toward the optical fiber 11 along the second direction with respect to total power of the first light beam L1 reflected by the wavelength combining element 45 is 80% or more. In addition, the wavelength combining element 45 is configured such that total power of the second light beam L2 emitted from the wavelength combining element 45 with respect to total power of the second light beam L2 incident on the wavelength combining element 45 and traveling toward the optical fiber 11 along the second direction is 80% or more.

As illustrated in FIG. 3, the first condenser lens 46 on which the first light beam L1 and the second light beam L2 emitted from the wavelength combining element 45 are directly incident is aligned with the wavelength combining element 45 along the second direction. The first condenser lens 46 is a lens that condenses the combined light beam SL of the incident first light beam L1 and second light beam L2 in the fast-axis direction. Therefore, each of the combined light beams SL emitted from the wavelength combining element 45 is incident on the first condenser lens 46 and is condensed in the third direction which is the fast-axis direction.

The second condenser lens 47 is aligned with the first condenser lens 46 along the second direction. The second condenser lens 47 is a lens that condenses the incident combined light beam SL in the slow-axis direction. Therefore, the combined light beam SL emitted from the first condenser lens 46 is condensed in the first direction which is the slow-axis direction.

The optical fiber 11 is aligned with the second condenser lens 47 along the second direction. The core of the optical fiber 11 is disposed on the optical path of the light beam transmitted through the second condenser lens 47. Therefore, the combined light beam SL transmitted through the second condenser lens 47 is incident on the core of the optical fiber 11 and propagates through the core. The combined light beam SL is light beam including a plurality of first light beams L1 having a wavelength of approximately 975 nm and a plurality of second light beams L2 having a wavelength of approximately 977 nm.

Next, the operation of the fiber laser device 1 will be described.

When predetermined power is supplied to each of the laser modules 20 constituting the pumping light source 2, the plurality of first light beams L1 having a wavelength of approximately 975 nm is emitted from the first LD group 31G, and the plurality of second light beams L2 having a wavelength of approximately 977 nm is emitted from the second LD group 32G. These light beams are combined by the above-described optical element group of the laser module 20, and propagate through the core of the optical fiber 11 as pumping light beam. The pumping light beams emitted from each laser module 20 are combined by the optical combiner 3. The combined pumping light beam is incident on the inner cladding 5b of the amplification optical fiber 5 via the inner cladding of the optical fiber 4. The inner cladding 5b is sandwiched between the core 5a having a refractive index higher than that of the inner cladding 5b and the outer cladding 5c having a refractive index lower than that of the inner cladding 5b, and the pumping light beam incident on the inner cladding 5b mainly propagates through the inner cladding 5b and is incident on the core 5a. Thus, the pumping light beam incident on the core 5a pumps ytterbium which is an active element added to the core 5a.

Figure 8:
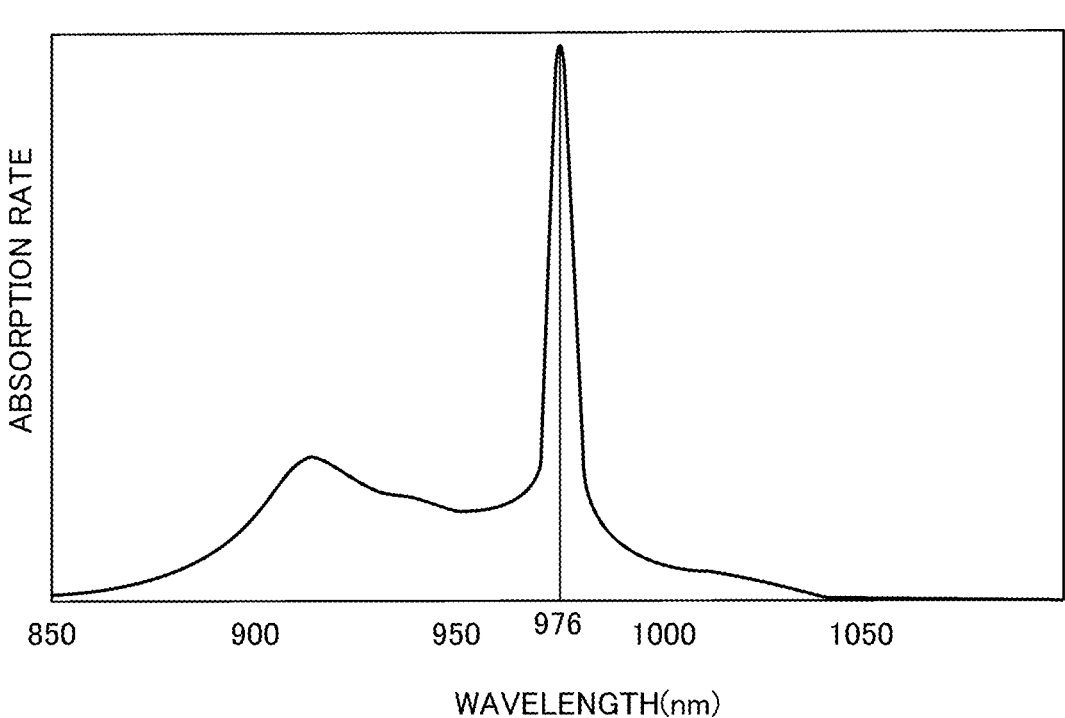
FIG. 8 is a diagram showing an absorption spectrum of light beam absorbed by an active element.

FIG. 8 is a diagram showing an absorption spectrum of light beam absorbed by ytterbium as an active element. As shown in FIG. 8, one of the peak wavelength bands in the absorption spectrum of ytterbium is approximately 970 nm or more and 982 nm or less. More specifically, this peak wavelength band is approximately 970 nm or more and 980 nm or less, and the peak in this peak wavelength band is approximately 976 nm in wavelength. In addition, the absorption rate of light beam having a wavelength of approximately 975 nm, which is the peak on the low wavelength side across the wavelength of approximately 976 nm, into ytterbium and the absorption rate of light beam having a wavelength of approximately 977 nm, which is the peak on the high wavelength side across the peak, into ytterbium can be considered to be equivalent at a part of the use temperature of the fiber laser device 1 described above, for example, at 0° C. or more and 60° C. or less, which is a general use temperature. In one or more embodiments, light beam having a wavelength of approximately 975 nm on the low wavelength side and light beam having a wavelength of approximately 977 nm on the high wavelength side across the peak wavelength are pumping light beams.

The ytterbium in the pumped state emits spontaneous emission light of a specific wavelength. The spontaneous emission light at this time is light beams having a constant wavelength band including a wavelength of 1070 nm. The spontaneous emission light propagates through the core 5a of the amplification optical fiber 5, and light beams having a part of the wavelength is reflected by the first FBG 7.

Among the light beams reflected in this manner, light beams having a wavelength reflected by the second FBG 8 is reflected by the second FBG 8, and reciprocates in the resonator. Then, when the light beams reflected by the first FBG 7 and the second FBG 8 propagates through the core 5a of the amplification optical fiber 5, stimulated emission occurs and the light beam is amplified, and when the gain and the loss in the resonator become equal, a laser oscillation state is obtained. Then, a part of the light beams resonating between the first FBG 7 and the second FBG 8 is transmitted through the second FBG 8 and emitted from the end of the optical fiber 6.

When the fiber laser device 1 is, for example, a laser processing device, light beam emitted from the end of the optical fiber 6 is applied to a workpiece via, for example, a processing head (not illustrated), and contributes to processing of the workpiece.

As described above, the laser module 20 of one or more embodiments includes the plurality of first LDs 31 that emit the first light beam L1, the plurality of second LDs 32 that emit the second light beam L2, the fast-axis collimating lens 36 and the slow-axis collimating lens 37 that are provided corresponding to the first LDs 31 and the second LDs 32, respectively, and collimate the light beam emitted from the LDs 31 and 32, respectively, and the wavelength combining element 45 including the diffraction grating. The first light beam L1 transmitted through the collimating lenses 36 and 37 and the second light beam L2 transmitted through the collimating lenses 36 and 37 are incident on the wavelength combining element 45. In addition, the wavelength combining element 45 reflects each of the first light beams L1 to the optical fiber 11 side in the second direction and emits each of the second light beams L2 to the optical fiber 11 side in the second direction, and superimposes each of the first light beams L1 and each of the second light beams L2 on each other in a one-to-one correspondence. In each of the plurality of pairs of the first light beam L1 and the second light beam L2 superimposed on each other, the fast axis of the first light beam L1 incident on the wavelength combining element 45 is parallel to the first plane passing through the entire section of the optical axis LA1 of the first light beam L1 from the mirror 44A2 to the wavelength combining element 45 and the entire section of the optical axis LA1 of the first light beam L1 from the wavelength combining element 45 to the first condenser lens 46, and the fast axis of the second light beam L2 incident on the wavelength combining element 45 is parallel to the second plane passing through the entire section of the optical axis LA1 of the first light beam L1 from the mirror 44A2 to the wavelength combining element 45 and the entire section of the optical axis LA1 of the first light beam L1 from the wavelength combining element 45 to the first condenser lens 46. As described above, in one or more embodiments, each of the first planes determined for the respective first light beams L1 and each of the second planes determined for the respective second light beams L2 are included in one reference plane SF.

In the laser module 20, the fast axis of each of the first light beams L1 incident on the wavelength combining element 45 is parallel to the reference plane SF including all of the first planes defined for the respective first light beams L1. In general, the width in the slow-axis direction of the light beam emitted from the LD is wider than the width in the fast-axis direction, and the beam quality in the slow-axis direction of the light beam is worse than the beam quality in the fast-axis direction. Therefore, when light beam emitted from the LD passes through the fast-axis collimating lens and the slow-axis collimating lens, a component in the slow-axis direction of the light beam is less likely to be collimated than a component in the fast-axis direction. As a result, after the light beam passes through the fast-axis collimating lens and the slow-axis collimating lens, a divergence angle in the slow-axis direction of the light with respect to the optical axis tends to be larger than a divergence angle in the fast-axis direction with respect to the optical axis. In a general laser module, after passing through a fast-axis collimating lens and a slow-axis collimating lens, a divergence angle of light beam in a fast-axis direction is, for example, approximately 0.05° to 0.1°, whereas a divergence angle of light beam in a slow-axis direction is, for example, approximately 0.5° to 1°, and the former divergence angle is smaller by about one digit than the latter divergence angle. Therefore, since the fast axis of each of the first light beams L1 incident on the wavelength combining element 45 is parallel to the reference plane SF, the spreading component of the first light beam L1 in the direction parallel to the reference plane SF is smaller than that in a case where the slow axis of the first light beam L1 is parallel to the reference plane SF. Therefore, a component that is not diffracted in the direction toward the optical fiber 11 in the second direction among the respective first light beams L1 can be reduced, and it is possible to suppress a decrease in coupling efficiency of the first light beam L1 coupled to the optical fiber 11 via the condenser lenses 46 and 47. In addition, in the laser module 20, the fast axis of each of the second light beams L2 incident on the wavelength combining element 45 is parallel to the reference plane SF including all of the second planes determined for the respective second light beams L2. Therefore, the spreading component in the direction parallel to the reference plane SF of all the second light beams L2 is reduced. Therefore, a component that is not diffracted in the direction toward the optical fiber 11 in the second direction among the respective second light beams L2 can be reduced, and it is possible to suppress a decrease in coupling efficiency of the second light beam L2 coupled to the optical fiber 11 via the condenser lenses 46 and 47. Therefore, according to the laser module 1, by using the diffraction grating as the wavelength combining element 45, it is possible to suppress a decrease in diffraction efficiency, and as a result, it is possible to increase the density of emitted light beam and emit high-luminance light beam.

Note that, in one or more embodiments, the spreading component in the slow-axis direction of the first light beam L1 and the second light beam L2 incident on the wavelength combining element 45 is large, but the spreading component in the direction perpendicular to the reference plane SF of the light beam incident on the wavelength combining element 45 has a smaller influence on the interference between the light beams emitted from the wavelength combining element 45 than the spreading component in the direction parallel to the reference plane SF.

In addition, as described above, the wavelength combining element 45 of one or more embodiments is configured such that total power of the first light beam L1 reflected by the wavelength combining element 45 with respect to total power of the first light beam L1 incident on the wavelength combining element 45 and traveling toward the optical fiber 11 along the second direction is 80% or more. In addition, the wavelength combining element 45 is configured such that total power of the second light beam L2 emitted from the wavelength combining element 45 with respect to total power of the second light beam L2 incident on the wavelength combining element 45 and traveling toward the optical fiber 11 along the second direction is 80% or more. With such a configuration, since 80% or more of each of the light beam L1 and the light beam L2 incident on the wavelength combining element 45 is emitted to the optical fiber 11 side along the second direction, the density of the light beam emitted from the wavelength combining element 45 is further increased. It is not essential that the content is 80% or more.

As described above, in the laser module 20, the wavelength of light beam emitted from the LDs 31 and 32 is 970 nm or more and 982 nm or less. As described above, ytterbium is added as an active element to the core 5a of the amplification optical fiber 5 of the fiber laser device 1 including the laser module 20. One of peak wavelength bands in an absorption spectrum of light beam absorbed by the ytterbium is approximately 970 nm or more and 982 nm or less. Therefore, according to one or more embodiments, the light beam emitted from the laser module 20 is effectively absorbed by ytterbium of the amplification optical fiber 5.

As described above, the fiber laser device 1 according to one or more embodiments includes the laser module 20 and the amplification optical fiber 5 in which light beam emitted from the laser module 20 is incident and an active element pumped by the light beam is added to the core 5a. According to such a configuration, since the pumping light beam falling within the peak wavelength band of the active element of the amplification optical fiber 5 has high density and high luminance due to the laser module 20, the absorption efficiency of the pumping light beam in the amplification optical fiber 5 can be enhanced.

In addition, in the fiber laser device 1 of one or more embodiments, as described above, the wavelength of the first light beam L1 and the wavelength of the second light beam L2 are located on the low wavelength side and the high wavelength side with respect to the peak wavelength in the absorption spectrum of the light beam absorbed by ytterbium as the active element. Since the LDs mounted on the same laser module are mounted on the same laser module, their external environments and driving conditions are substantially the same. For this reason, the wavelength shift directions of the light beams emitted from the respective LDs tend to be the same direction, and both tend to shift to the long wavelength side or the short wavelength side. Therefore, as described above, if the wavelength of the first light beam L1 and the wavelength of the second light beam L2 are located on the low wavelength side and the high wavelength side with the peak wavelength interposed therebetween, when a wavelength shift to, for example, the long wavelength side occurs in each LD due to a temperature change of the fiber laser device 1 or the like, the wavelength of the first light beam L1 on the low wavelength side can be shifted to a wavelength at which the absorption rate to the active element increases, and the wavelength of the second light beam L2 on the high wavelength side can be shifted to a wavelength at which the absorption rate to the active element decreases. Therefore, when the wavelength shift occurs, the absorption rate of the first light beam L1 to the active element and the absorption rate of the second light beam L2 to the active element can be balanced as a whole, and a change in behavior of the laser device due to a change in absorption efficiency of the pumping light beam to the active element can be suppressed. It is not essential that the wavelength of the first light beam L1 and the wavelength of the second light beam L2 are located on the low wavelength side and the high wavelength side with respect to the peak wavelength in the absorption spectrum of the light beam absorbed by ytterbium as the active element.

In addition, in the fiber laser device 1 of one or more embodiments, as described above, at a part of the use temperature of the fiber laser device, for example, at 0° C. or more and 60° C. or less, the absorption rate of the first light beam L1 having a wavelength of approximately 975 nm into ytterbium and the absorption rate of the second light beam L2 having a wavelength of approximately 977 nm into ytterbium are equal to each other. When there is a difference between the absorption rate of the first light beam L1 to the active element and the absorption rate of the second light beam L2 to the active element at such a temperature, it is necessary to design the addition amount of the active element, the length of the amplification optical fiber, and the like in consideration of the difference in absorption rate. On the other hand, as described above, if the absorption rate of the first light beam L1 to the active element and the absorption rate of the second light beam L2 to the active element are the same at a part of a general use temperature of the fiber laser device, it is possible to determine the addition amount of the active element and the like in accordance with a single absorption rate, and it is easy to design. Note that it is not an essential configuration that the absorption rate of the first light beam L1 to the active element and the absorption rate of the second light beam L2 to the active element are equal at a part of a general use temperature of the fiber laser device.

In one or more embodiments, an example in which a diffraction grating is used as the wavelength combining element 45 has been described, but a VBG may be used.

Next, another embodiment will be described. Components that are the same as or equivalent to those of the above embodiments are denoted by the same reference numerals and redundant description is omitted unless otherwise specified.

Figure 9:
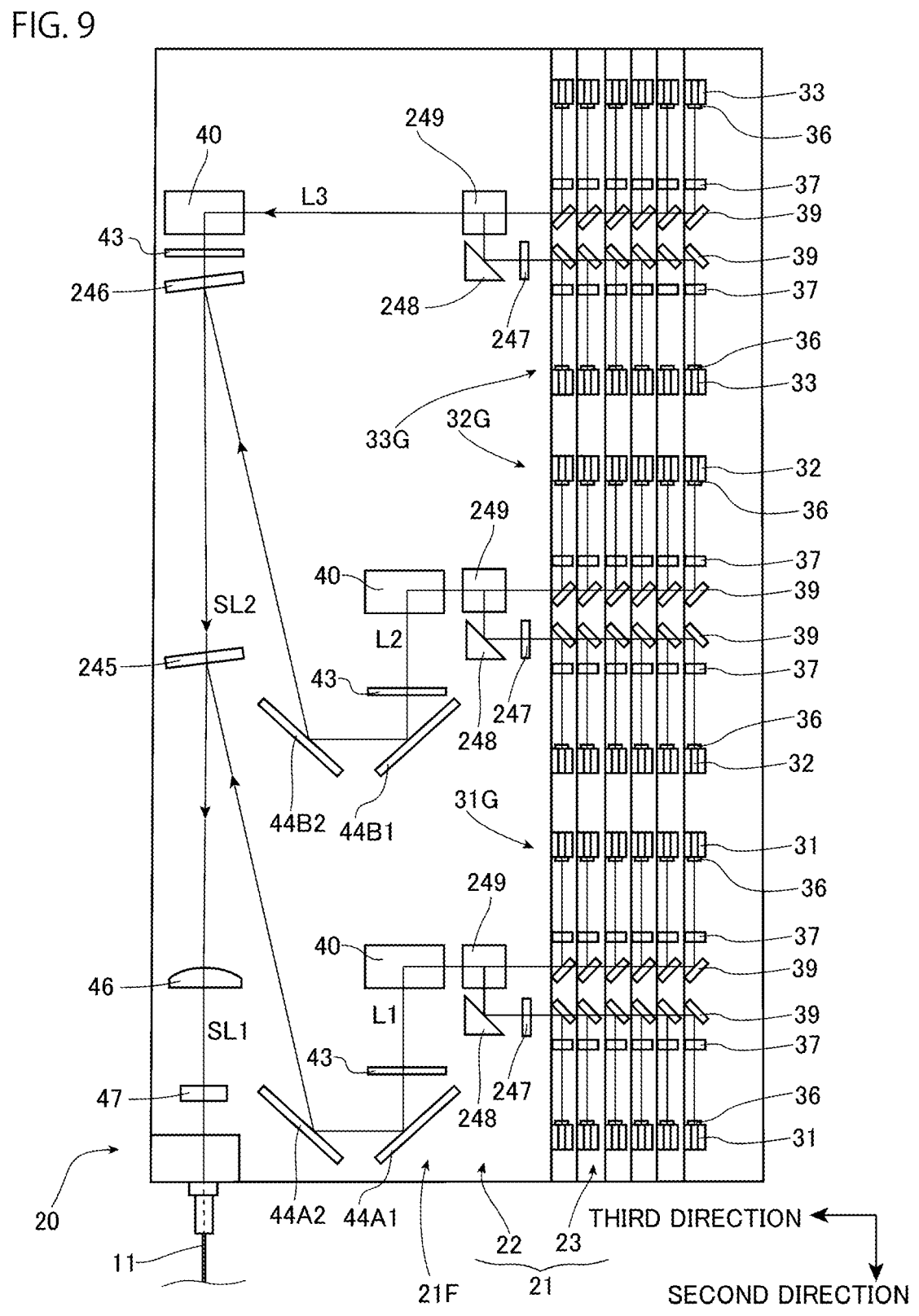

The fiber laser device of one or more embodiments has the same configuration as the fiber laser device 1 of the above embodiments except that the fiber laser device includes a laser module having a configuration different from that of the laser module 20 of the above embodiments. FIG. 9 is a plan view illustrating the laser module 20 of one or more embodiments from the same viewpoint as FIG. 3. As illustrated in FIG. 9, the laser module 20 of one or more embodiments has the same configuration as the laser module 20 of the above embodiments except that the number and type of optical element groups are different from those of the laser module 20 of the above embodiments. Therefore, hereinafter, differences of the optical element group of one or more embodiments from the above embodiments will be mainly described.

The optical element group of one or more embodiments includes a plurality of LDs, a plurality of fast-axis collimating lenses 36, a plurality of slow-axis collimating lenses 37, a plurality of mirrors 39, three wave plates 247, three mirrors 248, three polarization combining elements 249, three optical rotating elements 40, three wavelength stabilizing elements 43, a first wavelength combining element 245, a second wavelength combining element 246, a first condenser lens 46, and a second condenser lens 47. The plurality of LDs, the collimating lenses 36 and 37, and the mirror 39 are arranged in the stepped portion 23, and the other optical elements are arranged in the flat plate portion 22.

Similarly to the plurality of LDs of the above embodiments, the plurality of LDs of one or more embodiments are arranged in the stepped portion 23 such that the active layer is parallel to the mounting surface 21F. However, the num-ber of the plurality of LDs and the wavelength of light beam emitted from a part of the plurality of LDs are different from those of the plurality of LDs of the above embodiments.

In one or more embodiments, the plurality of LDs includes, for example, a first LD group 31G including a plurality of first LDs 31 that emit first light beam L1 having a wavelength of approximately 975 nm, a second LD group 32G including a plurality of second LDs 32 that emit second light beam L2 having a wavelength of approximately 976 nm, and a third LD group 33G including a plurality of third LDs 33 that emit third light beam L3 having a wavelength of approximately 977 nm, for example. In one or more embodiments, the difference between the wavelength of the second light beam L2 and the wavelength of the first light beam L1 and the difference between the wavelength of the third light beam L3 and the wavelength of the second light beam L2 are both approximately 1 nm and less than 2 nm.

The LD groups 31G, 32G, and 33G are arranged along the second direction, the LD group arranged closest to the optical fiber 11 is the first LD group 31G, and the LD group arranged farthest from the optical fiber 11 is the third LD group 33G. Each of the LD groups 31G, 32G, and 33G includes a plurality of LDs arranged on one side in the second direction and a plurality of LDs arranged on the other side, and a pair of one LD arranged on one side and one LD arranged on the other side in each of the LD groups 31G, 32G, and 33G is arranged in each step. In this way, each of the LDs on one side emits light beam toward the LD on the other side arranged in the same step, and each of the LDs on the other side emits light beam toward the LD on one side arranged in the same step. Here, the one side is a side close to the optical fiber 11 in the second direction in each of the LD groups 31G, 32G, and 33G, and the other side is a side far from the optical fiber 11 in the second direction.

The collimating lenses 36 and 37 and the mirror 39 are arranged corresponding to each of the plurality of LDs. In each of the LD groups 31G, 32G, and 33G, the mirror 39 on one side and the mirror 39 on the other side arranged on the same step are adjacent to each other. In each of the LD groups 31G, 32G, and 33G, the mirror 39 on one side reflects light beam emitted from the LDs on one side arranged in the same step toward the flat plate portion 22 in the third direction, and the mirror 39 on the other side reflects light beam emitted from the LDs on the other side arranged in the same step toward the optical fiber 11 in the third direction.

The light beams reflected by the mirror 39 on each of the one side and the other side is light beam collimated by the collimating lenses 36 and 37. In each of the LD groups 31G, 32G, and 33G, the light beam reflected by the mirror 39 on each of one side and the other side is arranged as illustrated in FIG. 4.

The three wave plates 247 are provided in the vicinity of the boundary between the flat plate portion 22 and the stepped portion 23, and are arranged on a one-to-one basis on the optical path of the light beam reflected by the mirror 39 on one side in each of the LD groups 31G, 32G, and 33G. Each wave plate 247 is a half-wave plate that rotates the polarization direction of light beam by 90°. Therefore, the polarization direction of each of the light beams emitted from the mirror 39 on one side is rotated by 90° with respect to the polarization direction of each of the light beams emitted from the mirror 39 on the other side by the wave plate 247.

The three mirrors 248 are disposed on the optical paths of the respective light beams transmitted through the wave plate 247. The mirror 248 has a reflecting surface that reflects light beam propagating toward the optical fiber 11 in the third direction to the side opposite to the optical fiber 11 in the second direction. Therefore, the light beam is reflected by the mirror 248 and propagates toward the light beam reflected by the mirror 39 on the other side. The slow axis of the light beam reflected by the mirror 248 is parallel to the third direction, and the fast axis is parallel to the first direction.

The three polarization combining elements 249 are arranged on the optical path of the light beam reflected by the mirror 39 on the other side and on the optical path of the light beam reflected by the mirror 248. The polarization combining element 249 has, for example, a configuration in which two right angle prisms are bonded to each other and a dielectric multilayer film is provided on one prism, and transmits one of two light beams having polarization directions different from each other by 90° and reflects the other light beam in directions different from each other by 90° with respect to the incident direction. In one or more embodiments, the light beam reflected by the mirror 39 on the other side is transmitted, and the light beam reflected by the mirror 248 is reflected toward the optical fiber 11 in the third direction.

In this way, the twelve first light beams L1 are combined by the polarization combining element 249, and propagate toward the optical fiber 11 in the third direction. The first light beam L1 emitted from the polarization combining element 249 is arranged in parallel as illustrated in FIG. 4, and the slow axis is parallel to the second direction and the fast axis is parallel to the first direction. In one or more embodiments, the six first light beams L1 located on one side and the six first light beams L1 located on the other side are combined on a one-to-one basis, whereby the six first light beams L1 are arranged as illustrated in FIG. 4. Note that the twelve second light beams L2 and the twelve third light beams L3 are also combined on a one-to-one basis in the other polarization combining element 249, whereby the six light beams are arranged as illustrated in FIG. 4. The second light beam L2 and the third light beam L3 emitted from the polarization combining element 249 also propagate toward the optical fiber 11 in the third direction.

The three optical rotating elements 40 are arranged on the respective optical paths of the light beams L1, L2, and L3. In one or more embodiments, the configuration of the optical rotating element 40 is substantially similar to the configuration of the optical rotating element 40 of the above embodiments. When each of the light beams L1, L2, and L3 is incident on the corresponding optical rotating element 40, the light beam propagates toward the optical fiber 11 in the second direction. As illustrated in FIG. 6, the slow axis of each of the light beams L1, L2, and L3 emitted from the optical rotating element 40 is parallel to the first direction, and the fast axis is parallel to the third direction.

The three wavelength stabilizing elements 43 are provided on the respective optical paths of the light beams L1, L2, and L3 emitted from the optical rotating element 40. In one or more embodiments, each wavelength stabilizing element 43 has substantially the same configuration as the wavelength stabilizing element 43 of the above embodiments. From each of the wavelength stabilizing elements 43, the first light beam L1 whose wavelength is stabilized at approximately 975 nm, the second light beam L2 whose wavelength is stabilized at approximately 976 nm, and the third light beam L3 whose wavelength is stabilized at approximately 977 nm propagate toward the optical fiber 11 in the second direction.

Among the pair of mirrors 44A1 and 44A2, the mirror 44A1 is disposed on the optical path of each of the first light beams L1 emitted from the wavelength stabilizing element 43, and reflects each of the first light beams L1 toward the mirror 44A2. The mirror 44A2 reflects the first light beam L1 reflected by the mirror 44A1 toward the first wavelength combining element 245. In this way, the first light beam L1 reflected by the mirror 44A2 is incident on the first wavelength combining element 245. Therefore, the mirror 44A2 is an optical element that causes the first light beam L1 to be directly incident on the first wavelength combining element 245. Among the pair of mirrors 44B1 and 44B2, the mirror 44B1 is disposed on the optical path of each of the second light beams L2 emitted from the wavelength stabilizing element 43, and reflects each of the second light beams L2 toward the mirror 44B2. The mirror 44B2 reflects the second light beam L2 reflected by the mirror 44B1 toward the second wavelength combining element 246. In this way, the second light beam L2 reflected by the mirror 44B2 is incident on the second wavelength combining element 246. Therefore, the mirror 44B2 is an optical element that causes the second light beam L2 to be directly incident on the second wavelength combining element 246.

The second wavelength combining element 246 is disposed on the optical path of each of the third light beams L3 emitted from the wavelength stabilizing element 43 and on the optical path of each of the second light beams L2 reflected by the mirror 44B2. Therefore, the wavelength stabilizing element 43 through which the third light beam L3 is transmitted is an optical element that causes the third light beam L3 to be directly incident on the second wavelength combining element 246. The second wavelength combining element 246 is a VBG that reflects each of the second light beams L2 and transmits and emits each of the third light beams L3 under a predetermined condition. The second wavelength combining element 246 is inclined at a predetermined angle with respect to the second direction and the third direction. The inclination of the second wavelength combining element 246 is an inclination at which the incident angle of the third light beam L3 incident on the second wavelength combining element 246 becomes the first incident angle, and is an inclination at which the incident angle of the second light beam L2 incident on the second wavelength combining element 246 becomes the second incident angle different from the first incident angle. In the second wavelength combining element 246, the refractive index change is periodically formed so that the light beam L2 and the light beam L3 are emitted in substantially the same predetermined direction in a case where the second light beam L2 is incident at the second incident angle and the third light beam L3 is incident at the first incident angle. The predetermined direction in one or more embodiments is a direction toward the optical fiber 11 in the second direction. Therefore, each of the second light beams L2 incident on the second wavelength combining element 246 is reflected by the second wavelength combining element 246 and emitted toward the optical fiber 11. In addition, each of the third light beams L3 incident on the second wavelength combining element 246 is transmitted through the second wavelength combining element 246, superimposed with each of the second light beams L2 on a one-to-one basis, and emitted toward the optical fiber 11. In this way, a plurality of combined light beams SL2 are formed, and these combined light beams SL2 propagate toward the first wavelength combining element 245. Therefore, the first wavelength combining element 245 is an optical element on which the second light beam L2 and the third light beam L3 emitted from the second wavelength combining element 246 are directly incident.

Here, among the second light beams L2 and the third light beams L3, for each pair of the second light beam L2 and the third light beam L3 superimposed on each other, a first plane passing through the entire section of the optical axis of the second light beam L2 from the mirror 44B2, which is an optical element that causes the second light beam L2 to be directly incident on the second wavelength combining element 246, to the second wavelength combining element 246 and the entire section of the optical axis of the second light beam L2 from the second wavelength combining element 246 to the first wavelength combining element 245, which is an optical element on which the second light beam L2 emitted from the second wavelength combining element 246 is directly incident, is determined. The first plane is a plane determined for each of the second light beams L2. In one or more embodiments, each of the first planes determined for the respective second light beams L2 can be parallel to the mounting surface 21F. In this case, the fast axis of each of the second light beams L2 incident on the second wavelength combining element 246 is parallel to the first plane in the pair. In addition, in one or more embodiments, since the heights of the optical axes of the respective second light beams L2 incident on the second wavelength combining element 246 coincide with each other, the heights of the respective first planes can be made the same. Therefore, in one or more embodiments, each of the first planes can be included in one reference plane overlapping each other.

In each of the pairs, a second plane passing through the entire section of the optical axis of the second light beam L2 from the mirror 44B2 to the second wavelength combining element 246 and the entire section of the optical axis of the second light beam L2 from the second wavelength combining element 246 to the first wavelength combining element 245 is defined. The second plane is a plane determined for each of the third light beams L3. In one or more embodiments, each of the second planes determined for the respective third light beams L3 can be made parallel to the mounting surface 21F. In one or more embodiments, the height of the optical axis of each of the third light beams L3 incident on the second wavelength combining element 246 coincides with the height of the optical axis of each of the second light beams L2 incident on the second wavelength combining element 246, and the height of the optical axis of each of the third light beams L3 reflected by the second wavelength combining element 246 coincides with the height of the optical axis of each of the second light beams L2 reflected by the second wavelength combining element 246. Therefore, the height of each of the second planes can be the same as the height of the first plane. Therefore, in one or more embodiments, each of the second planes can be included in the reference plane SF.

The first wavelength combining element 245 is disposed on the optical path of each of the combined light beams SL2 and the optical path of each of the first light beams L1 reflected by the mirror 44A2. The combined light beam SL2 emitted from the second wavelength combining element 246 is incident on the first wavelength combining element 245. Therefore, the second wavelength combining element 246 that emits the combined light beam SL2 is an optical element that causes the second light beam L2 and the third light beam L3 to be directly incident on the first wavelength combining element 245. In one or more embodiments, the first wavelength combining element 245 is a VBG that reflects the first light beam L1 and transmits and emits the second light beam L2 and the third light beam L3 forming the combined light beam SL2 under a predetermined condition. The first wavelength combining element 245 is inclined at a predetermined angle with respect to the second direction and the third direction. The inclination of the first wavelength combining element 245 is an inclination at which the incident angle of the first light beam L1 incident on the first wavelength combining element 245 becomes the third incident angle, and is an inclination at which the incident angles of the second light beam L2 and the third light beam L3 incident on the first wavelength combining element 245 become the fourth incident angle different from the third incident angle. In the first wavelength combining element 245, the refractive index change is periodically formed so that the first light beam L1, the second light beam L2, and the third light beam L3 are emitted in substantially the same predetermined direction in a case where the first light beam L1 is incident at the third incident angle and the second light beam L2 and the third light beam L3 are incident at the fourth incident angle. The predetermined direction in one or more embodiments is a direction toward the optical fiber 11 in the second direction. Therefore, each of the first light beams L1 incident on the first wavelength combining element 245 is reflected by the first wavelength combining element 245 and emitted toward the first condenser lens 46. In addition, each of the second light beam L2 and the third light beam L3 incident on the first wavelength combining element 245 passes through the first wavelength combining element 245 and is superimposed on the first light beam L1 on a one-to-one basis to form a plurality of combined light beams SL1 including one first light beam L1, one second light beam L2, and one third light beam L3, and these combined light beams SL1 propagate toward the first condenser lens 46. Therefore, the first condenser lens 46 is an optical element on which the first light beam L1, the second light beam L2, and the third light beam L3 emitted from the first wavelength combining element 245 are directly incident.

Here, among the first light beams L1 and the second light beams L2, for each pair of the first light beam L1 and the second light beam L2 superimposed on each other, a first plane passing through the entire section of the optical axis of the first light beam L1 from the mirror 44A2 to the first wavelength combining element 245, which is an optical element that causes the first light beam L1 to be directly incident on the first wavelength combining element 245, and the entire section of the optical axis of the first light beam L1 from the first wavelength combining element 245 to the first condenser lens 46, which is an optical element on which the first light beam L1 emitted from the first wavelength combining element 245 is directly incident, is determined. The first plane is a plane determined for each of the first light beams L1. In one or more embodiments, each of the first planes determined for the respective first light beams L1 can be parallel to the mounting surface 21F. In this case, the fast axis of each of the first light beams L1 incident on the first wavelength combining element 245 is parallel to the first plane in each pair. In addition, in one or more embodiments, the heights of the optical axes of the respective first light beams L1 incident on the first wavelength combining element 245 coincide with each other, and the heights of the respective first planes can be made the same. Therefore, in one or more embodiments, each of the first planes can be included in one reference plane overlapping each other.

In each of the pairs, a second plane passing through the entire section of the optical axis of the first light beam L1 from the mirror 44A2 to the first wavelength combining element 245 and the entire section of the optical axis of the first light beam L1 from the first wavelength combining element 245 to the first condenser lens 46 is defined. The second plane is a plane determined for each of the second light beams L2. In one or more embodiments, each of the second planes determined for the respective second light beams L2 can be parallel to the mounting surface 21F. In addition, in one or more embodiments, the height of the optical axis of each of the second light beams L2 incident on the first wavelength combining element 245 coincides with the height of the optical axis of each of the first light beams L1 incident on the first wavelength combining element 245, and the height of the optical axis of each of the second light beams L2 transmitted through the first wavelength combining element 245 coincides with the height of the optical axis of each of the first light beams L1 reflected by the first wavelength combining element 245. Therefore, the height of each of the second planes can be the same as the height of the first plane. Therefore, in one or more embodiments, each of the second planes can be included in the reference plane SF.

The second plane is defined from another point of view. Specifically, among the first light beams L1 and the third light beams L3, for each pair of the first light beam L1 and the third light beam L3 superimposed on each other, a second plane passing through the entire section of the optical axis of the first light beam L1 from the mirror 44A2 to the first wavelength combining element 245 and the entire section of the optical axis of all the first light beam L1 from the first wavelength combining element 245 to the first condenser lens 46 is defined. The second plane is a plane determined for each of the third light beams L3. In one or more embodiments, each of the second planes determined for the respective third light beams L3 can be made parallel to the mounting surface 21F. In addition, in one or more embodiments, the height of the optical axis of each of the third light beams L3 incident on the first wavelength combining element 245 coincides with the height of the optical axis of each of the first light beams L1 incident on the first wavelength combining element 245, and the height of the optical axis of each of the third light beams L3 transmitted through the first wavelength combining element 245 coincides with the height of the optical axis of each of the first light beams L1 reflected by the first wavelength combining element 245. Therefore, the height of each of the second planes can be the same as the height of the first plane. Therefore, in one or more embodiments, each of the second planes can be included in the reference plane SF.

After the combined light beam SL1 emitted from the first wavelength combining element 245 is incident on the first condenser lens 46, the combined light beam SL1 is incident on the second condenser lens 47, condensed in the fast-axis direction and the slow-axis direction, and incident on the core of the optical fiber 11.

The combined light beam SL1 pumps ytterbium added to the core 5a of the amplification optical fiber 5. As shown in FIG. 8, the absorption rate of light beam having a wavelength of approximately 975 nm on the low wavelength side into ytterbium and the absorption rate of light beam having a wavelength of approximately 977 nm on the high wavelength side into ytterbium are equal to each other across a wavelength of approximately 976 nm which is a peak in the absorption spectrum of ytterbium. In one or more embodiments, such light beam having a wavelength of approximately 975 nm, light beam having a wavelength of approximately 976 nm, and light beam having a wavelength of approximately 977 nm are pumping light beams.

As described above, in the laser module 20 of one or more embodiments, the fast axis of each of the second light beams L2 incident on the second wavelength combining element 246 is parallel to the reference plane including the first plane defined for each of the second light beams L2. Therefore, the spreading component of the second light beam L2 in the direction parallel to the reference plane is smaller than that in a case where the slow axis of the second light beam L2 is parallel to the reference plane. Therefore, the number of components of each of the second light beams L2 that are not diffracted in the direction toward the first wavelength combining element 245 in the second direction can be reduced. In the laser module 20, the fast axis of each of the third light beams L3 incident on the second wavelength combining element 246 is parallel to the reference plane including the second plane defined for each of the third light beams L3. Therefore, the spreading component in the direction parallel to the reference plane of the third light beam L3 is reduced. Therefore, a component of each of the third light beams L3 that is not diffracted in the direction toward the first wavelength combining element 245 in the second direction can be reduced.

In one or more embodiments, when the second light beam L2 reflected by the second wavelength combining element 246 is replaced with the first light beam L2 and the third light beam L3 transmitted through the second wavelength combining element 246 is replaced with the second light beam L3, the second wavelength combining element 246 reflects each of the first light beams L2 in a predetermined direction, superimposes each of the second light beams L3 on each of the first light beams L2 on a one-to-one basis, and emits the light beam in the predetermined direction. In each pair of the first light beam L2 and the second light beam L3 superimposed on each other, the fast axis of the first light beam L2 incident on the second wavelength combining element 246 is parallel to the first plane in the pair, and the fast axis of the second light beam L3 incident on the second wavelength combining element 246 is parallel to the second plane in the pair.

In addition, in the laser module 20 of one or more embodiments, the fast axis of each of the first light beams L1 incident on the first wavelength combining element 245 is parallel to the reference plane including the first plane defined for each of the first light beams L1. Therefore, the spreading component in the direction parallel to the reference plane of the first light beam L1 is smaller than that in the case where the slow axis of the first light beam L1 is parallel to the reference plane. Therefore, a component that is not diffracted to the optical fiber 11 side in the second direction in each of the first light beams L1 can be reduced. In this laser module, the fast axis of each of the second light beams L2 incident on the first wavelength combining element 245 is parallel to the reference plane including the second plane defined for each of the second light beams L2. Therefore, the spreading component in the direction parallel to the reference plane of the second light beam L2 is reduced. Therefore, a component that is not diffracted in the direction toward the first condenser lens 46 in the second direction among the respective second light beams L2 can be reduced. Further, in the laser module 20, the fast axis of each of the third light beams L3 incident on the first wavelength combining element 245 is parallel to the reference plane including the second plane defined for each of the third light beams L3. Therefore, the spreading component in the direction parallel to the reference plane of the third light beam L3 is reduced. Therefore, a component that is not diffracted in the direction toward the first condenser lens 46 in the second direction among the respective third light beams L3 can be reduced. Therefore, according to the laser module 20 of one or more embodiments, the light beams L1, L2, and L3 are combined in a state in which a decrease in diffraction efficiency is suppressed, and the density of light beam is increased, and high-luminance light beam can be emitted.

Note that, similarly to the above embodiments, the spreading components in the slow-axis direction of the first light beam, the second light beam, and the third light beam incident on the wavelength combining element are large, but the spreading component in the direction perpendicular to the reference plane of the light beam incident on the wavelength combining element has a smaller influence on the interference between the light beams emitted from the wavelength combining element than the spreading component in the direction parallel to the reference plane. Therefore, by reducing the spreading component of the light beam parallel to the reference plane as described above, it is possible to suppress a decrease in diffraction efficiency in the wavelength combining element.

Further, in one or more embodiments, unlike the above embodiments, three LD groups are provided, and the number of LDs constituting each LD group is twice the number of LDs constituting the LD group of the above embodiments. Therefore, the density of light beam is further increased, and high-luminance light beam with higher output can be generated.

Note that, in one or more embodiments, an example has been described in which the first wavelength combining element 245 that combines the light beams L1, L2, and L3 and the second wavelength combining element 246 that combines the light beams L2 and L3 are provided, and all of the light beams L1, L2, and L3 are combined. However, at least two of the light beams L1, L2, and L3 may be combined. For example, only the first wavelength combining element 245 may be provided to combine only the light beams L1 and L2. Alternatively, only the second wavelength combining element 246 may be provided, and only the light beams L2 and L3 may be combined.

Furthermore, in one or more embodiments, an example in which the wavelength combining elements 245 and 246 are VBGs has been described, but at least one of them may be a diffraction grating.

Each of the first to fourth incident angles may be, for example, 3° or more and less than 90°, or may be 3° or more and 45° or less. Furthermore, each of the wavelength combining elements 245 and 246 may be configured such that total power of light beam incident on the wavelength combining element with respect to total power of light beam emitted from the wavelength combining element is 80% or more.

Although the present invention has been described by taking the above-described embodiments as an example, the present invention is not limited thereto.

For example, in the above embodiments, an example has been described in which there are two types or three types of light beam having different wavelengths, but for example, a fourth LD group that emits light beam having a fourth wavelength may be further provided, and there may be four types of light beam having different wavelengths. As described above, the number of types of light beam may be four or more. In addition, as described in the latter embodiments, even in a case where the number of types of light beam is four or more, two types of light beam having at least different wavelengths may be combined.

In the above embodiments, an example in which ytterbium is used as the active element has been described, but the active element is not limited to ytterbium as described above. In one or more embodiments when an element different from ytterbium is used as the active element, the wavelength of the light beam emitted from the LD may be the wavelength of the peak wavelength band in the absorption spectrum of the light beam absorbed by the active element.

In the above embodiments, the example in which the interval between the wavelength of the N-th light beam and the wavelength of the (N+1)-th light beam (N is 1 or more) is less than 2 nm has been described, but this interval may be 2 nm or more. However, if this interval is less than 2 nm, even when the peak wavelength band is narrow as described above, it is easy to keep light beam of all wavelengths within the peak wavelength band.

In addition, when a VBG is used as the wavelength combining element, the wavelength combining element may be a VBG having apodization. According to such a configuration, when side lobes are generated in the distribution of the diffraction efficiency of the VBG with respect to the wavelength of light beam incident on the VBG, the side lobes can be reduced. As a result, even light beams having short wavelength intervals can be combined without being interfered with side lobes.

In the above embodiments, the example in which each of the first planes is included in one reference plane SF parallel to the mounting surface 21F has been described. However, each of the first planes need not be included in one reference plane. This point will be described below.

Figure 10:
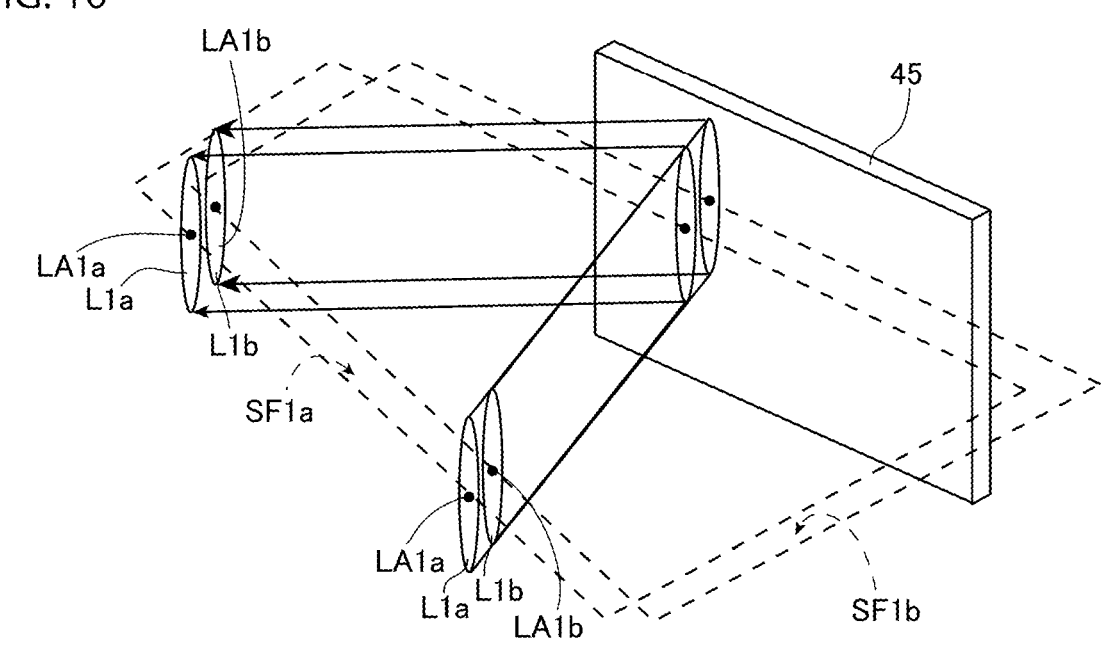
FIG. 10 is a view illustrating a first modification of the laser module of one or more embodiments of the present invention from the same viewpoint as FIG. 7.

For example, as illustrated in FIG. 10, a case is considered in which the fast axis of the first light beam L1a and the fast axis of the first light beam L1b are parallel, but the first light beam L1a and the first light beam L1b are shifted along the first direction. In this case, the heights of the optical axis LA1a of the first light beam L1a and the optical axis LA1b of the first light beam L1b do not coincide with each other. Therefore, the reference plane SF1a defined by the optical axis LA1a of the first light beam L1a and the first plane SF1b defined by the optical axis LA1b of the first light beam L1b are different planes. In FIG. 10, only a partial region of each of the reference plane SF1a and the first plane SF1b is illustrated.

Figure 11:
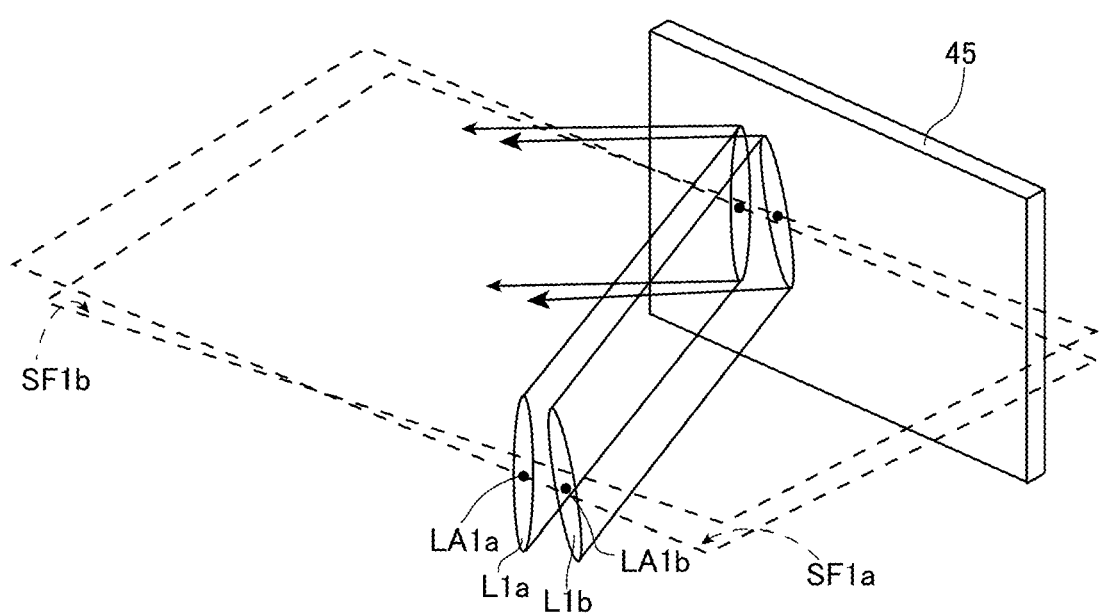
FIG. 11 is a view illustrating a second modification of the laser module of one or more embodiments of the present invention from the same viewpoint as FIG. 7.

In addition, as illustrated in FIG. 11, a case where the fast axis of the first light beam L1a and the fast axis of the first light beam L1b are not parallel is considered. In this case, the first plane SF1b defined by the first light beam L1b is inclined with respect to the reference plane SF1a. In the example of FIG. 11, the reference plane SF1a is a plane defined by the optical axis LA1a of the first light beam L1a. In FIG. 11, only a partial region of each of the reference plane SF1a and the first plane SF1b is illustrated. In this case, the first plane SF1b is a plane different from the reference plane SF1a, and does not pass through the optical axis LA1b of the first light beam L1b. However, the first plane SF1b needs to pass through the entire section of the first light beam L1b from the optical element that causes the first light beam L1b to be directly incident on the wavelength combining element 45 to the wavelength combining element 45 and the entire section of the first light beam L1b from the wavelength combining element 45 to the optical element on which the first light beam L1b emitted from the wavelength combining element 45 is directly incident. Under this condition, even when the first plane SF1b is inclined with respect to the reference plane SF1a, the inclination of the first plane SF1b with respect to the reference plane SF1a is small, and the inclination of the fast axis of the first light beam L1b defining the first plane SF1b with respect to the reference plane SF1a is also small. Therefore, even when the fast axis of the first light beam L1b is inclined, the spreading component of the first light beam L1b in the direction parallel to the reference plane SF1a decreases. However, from the viewpoint of suppressing a decrease in diffraction efficiency, the first plane may passes through the optical axis of the first light beam in one or more embodiments.

In the above embodiments, the example in which each of the second planes is included in one reference plane SF parallel to the mounting surface 21F has been described. However, as in FIG. 10, the fast axis of certain second light beam L2 is parallel to the fast axis of other second light beam L2, but certain second light beam L2 and other second light beam L2 may be shifted along the first direction. In this case, the height of the optical axis of a certain second light beam does not coincide with the height of the optical axis of another second light beam, and the second plane defined by the optical axis of a certain second light beam L2 and the second plane defined by the optical axis of another second light beam are different planes.

Figure 12:
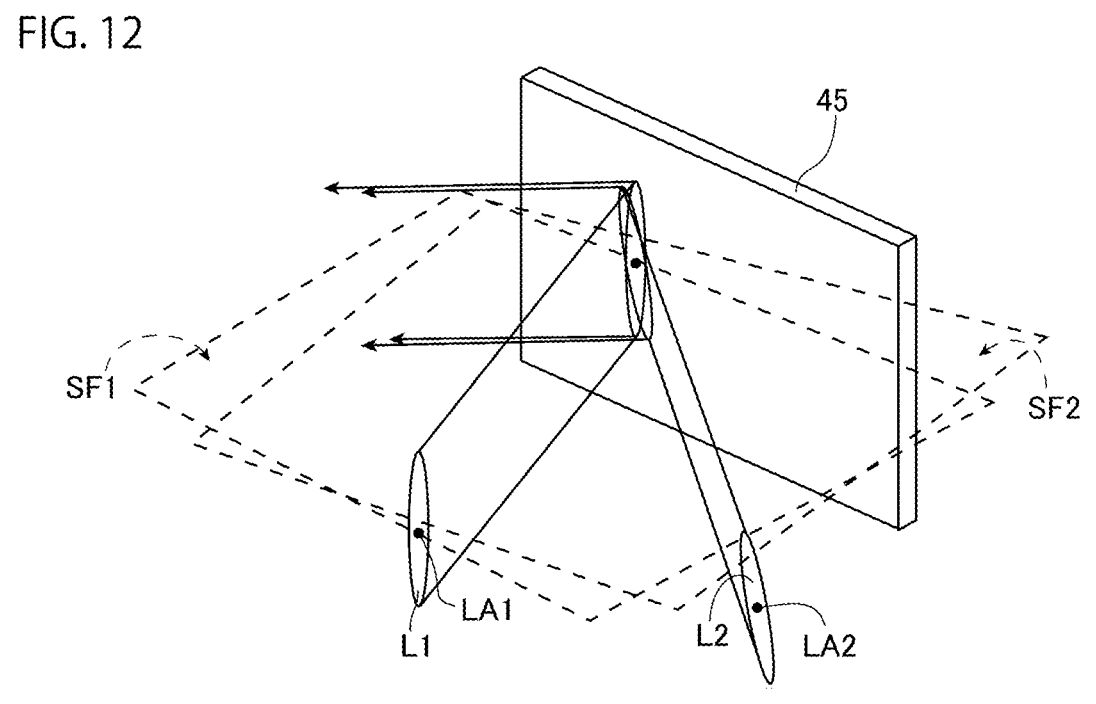

In addition, as illustrated in FIG. 12, a case where the fast axis of the second light beam L2 and the fast axis of the first light beam L1 are not parallel is considered. In this case, the second plane SF2 defined by the second light beam L2 is inclined with respect to the reference plane SF1 defined by the optical axis LA1 of the first light beam L1. In FIG. 12, only a partial region of each of the reference plane SF1 and the second plane SF2 is illustrated, and the first light beam L1 and the second light beam L2 are illustrated on a one-to-one basis. In the example of FIG. 12, the second plane SF2 defined by the second light beam L2 is a plane different from the reference plane SF1 defined by the first light beam L1, and does not pass through the optical axis LA2 of the second light beam L2. However, the second plane SF2 needs to pass through the entire section of the first light beam L1 from the optical element that causes the first light beam L1 to be directly incident on the wavelength combining element 45 to the wavelength combining element 45 and the entire section of the first light beam L1 from the wavelength combining element 45 to the optical element on which the first light beam L1 emitted from the wavelength combining element 45 is directly incident. Under this condition, even when the second plane SF2 is inclined with respect to the reference plane SF1, the inclination of the second plane SF2 with respect to the reference plane SF1 is small, and the inclination of the fast axis of the second light beam L2 defining the second plane SF2 with respect to the reference plane SF1 is also small. Therefore, even when the fast axis of the second light beam L2 is inclined, the spreading component of the second light beam L2 in the direction parallel to the reference plane SF1 decreases. However, from the viewpoint of suppressing a decrease in diffraction efficiency, the second plane SF2 may pass through the optical axis LA1 of the first light beam L1 in one or more embodiments. Note that, in the example of FIG. 12, an example in which the wavelength combining element is a diffraction grating has been described, but the same applies even when the wavelength combining element is a VBG.

However, the fast axes of the respective first light beams L1 incident on the wavelength combining element 45 may be parallel to each other in one or more embodiments. As a result, as compared with a case where the fast axes of at least a part of the fast axes of the respective first light beams L1 incident on the wavelength combining element 45 are not parallel to each other, each of the first light beams L1 can be brought close to each other, and the high-density first light beam L1 can be incident on the wavelength combining element 45. Therefore, light beam with higher luminance can be emitted. In addition, the fast axis of each of the second light beams L2 incident on the wavelength combining element 45 may be parallel to the fast axis of at least one first light beam L1 in one or more embodiments. As a result, as compared with a case where the fast axis of each of the second light beams L2 incident on the wavelength combining element 45 is not parallel to the fast axis of each of the first light beams L1, the degree of overlap between the first light beam L1 and the second light beam L2 can be increased, and the density of the first light beam L1 and the second light beam L2 incident on the wavelength combining element 45 can be increased. Therefore, light beam with higher luminance can be emitted. In addition, the fast axes of the respective second light beams L2 incident on the wavelength combining element 45 may be parallel to each other in one or more embodiments. As a result, as compared with a case where the fast axes of at least a part of the fast axes of the respective second light beams L2 incident on the wavelength combining element 45 are not parallel to each other, each of the second light beams L2 can be brought close to each other, and the high-density second light beam L2 can be incident on the wavelength combining element. Therefore, light beam with higher luminance can be emitted.

Furthermore, in the above embodiments, an example has been described in which the light beam incident on the wavelength combining element propagates in the direction parallel to the mounting surface, but the direction of the light beam emitted from the wavelength combining element is not limited to this direction.

According to the present invention, a laser module capable of emitting light beam with high luminance and a fiber laser device including the laser module are provided, and can be used in the field of laser processing and the like.

The invention claimed is:

1. A laser module including:
a first laser diode that emits a first light beam having a first wavelength;
a second laser diode that emits a second light beam having a second wavelength different from the first wavelength;
a fast-axis collimating lens disposed corresponding to each of the first and second laser diodes to collimate a fast-axis direction of each of the first and second light beams emitted from each of the first and second laser diodes;
a slow-axis collimating lens disposed corresponding to each of the first and second laser diodes to collimate a slow-axis direction of each of the first and second light beams emitted from each of the first and second laser diodes; and
a wavelength combining element including a volume Bragg grating (VBG) or a diffraction grating, wherein
the first light beam emitted from the first laser diode and transmitted through the fast-axis collimating lens and the slow-axis collimating lens and the second light beam emitted from the second laser diode and transmitted through the fast-axis collimating lens and the slow-axis collimating lens are incident on the wavelength combining element,
the wavelength combining element reflects the first light beam in a predetermined direction, superimposes the second light beam on the first light beam, and emits the second light beam in the predetermined direction, and
a fast axis of the first light beam incident on the wavelength combining element is parallel to a first plane passing through:
an entire section of the first light beam from an optical element, that causes the first light beam to be directly incident on the wavelength combining element, to the wavelength combining element; and an entire section of the first light beam from the wavelength combining element to an optical element on which the first light beam emitted from the wavelength combining element is directly incident, and a fast axis of the second light beam incident on the wavelength combining element is parallel to a second plane passing through:

an entire section of the first light beam from an optical element, that causes the first light beam to be directly incident on the wavelength combining element, to the wavelength combining element; and an entire section of the first light beam from the wavelength combining element to an optical element on which the first light beam emitted from the wavelength combining element is directly incident, the first laser diode, the second laser diode, and the wavelength combining element are mounted on mounting surfaces that are mutually parallel, the fast axis of the first light beam and the fast axis of the second light beam are parallel to the mounting surfaces upon entering the wavelength combining element, the first plane is parallel to the mounting surfaces and passes through:

an optical axis of the first light beam incident on the wavelength combining element; and an optical axis of the first light beam reflected by the wavelength combining element.

2. The laser module according to claim 1, wherein the second plane passes through:

an optical axis of the first light beam incident on the wavelength combining element; and an optical axis of the first light beam reflected by the wavelength combining element.

3. The laser module according to claim 1, wherein the laser module includes a plurality of the first laser diodes and a plurality of the second laser diodes, each of the first light beams emitted from the plurality of first laser diodes and each of the second light beams emitted from the plurality of second laser diodes is transmitted through the fast-axis collimating lens and the slow-axis collimating lens and is incident on the wavelength combining element, the wavelength combining element reflects each of the first light beams in the predetermined direction, superimposes each of the second light beams with each of the first light beams on a one-to-one basis, and emits each of the second light beams in the predetermined direction, and in each pair of the first light beam and the second light beam superimposed on each other, a fast axis of the first light beam incident on the wavelength combining element is parallel to the first plane in the pair, and a fast axis of the second light beam incident on the wavelength combining element is parallel to the second plane in the pair.

4. The laser module according to claim 3, wherein fast axes of the respective first light beams incident on the wavelength combining element are parallel to each other.

5. The laser module according to claim 3, wherein a fast axis of each of the second light beams incident on the wavelength combining element is parallel to a fast axis of at least one of the first light beams.

6. The laser module according to claim 3, wherein fast axes of the respective second light beams incident on the wavelength combining element are parallel to each other.

7. The laser module according to claim 1, wherein wavelengths of the first and second light beams emitted from the first laser diode and the second laser diode are 970 nm or more and 982 nm or less.

8. The laser module according to claim 7, wherein a wavelength of the first light beam and a wavelength of the second light beam are on opposite sides with respect to 976 nm, and a difference between the wavelength of the first light beam and the wavelength of the second light beam is within 2 nm.

9. The laser module according to claim 1, wherein an incident angle of the first light beam to the wavelength combining element and an incident angle of the second light beam to the wavelength combining element are each 3° or more.

10. The laser module according to claim 1, wherein the wavelength combining element is a VBG having apodization.

11. The laser module according to claim 1, wherein total power of the first light beam incident on the wavelength combining element and traveling in the predetermined direction with respect to the total power of the first light beam reflected by the wavelength combining element is 80% or more, and total power of the second light beam incident on the wavelength combining element and traveling in the predetermined direction with respect to the total power of the second light beam emitted from the wavelength combining element is 80% or more.

12. A fiber laser device comprising:

the laser module according to claim 1; and an amplification optical fiber on which a light beam emitted from the laser module is incident, wherein a core of the amplification optical fiber includes an active element pumped by the light beam.

13. The fiber laser device according to claim 12, wherein a wavelength of the first light beam and a wavelength of the second light beam are positioned on a low wavelength side and a high wavelength side across a peak wavelength in an absorption spectrum of the active element.

14. The fiber laser device according to claim 13, wherein an absorption rate of the first light beam by the active element and an absorption rate of the second light beam by the active element are equal to each other at a part of a use temperature of the fiber laser device.

* * * * *